US012567686B2

(12) United States Patent
Nozadze et al.

(10) Patent No.: US 12,567,686 B2
(45) Date of Patent: Mar. 3, 2026

(54) TERMINATION OF CABLES FOR A CONNECTOR

(71) Applicant: Cisco Technology, Inc., San Jose, CA (US)

(72) Inventors: David Nozadze, San Jose, CA (US); Mike Sapozhnikov, San Jose, CA (US); Amendra Koul, San Francisco, CA (US); Sayed Ashraf Mamun, San Jose, CA (US); Upen Reddy Kareti, Union City, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 375 days.

(21) Appl. No.: 18/455,803

(22) Filed: Aug. 25, 2023

(65) Prior Publication Data

US 2024/0356251 A1     Oct. 24, 2024

Related U.S. Application Data

(60) Provisional application No. 63/496,748, filed on Apr. 18, 2023.

(51) Int. Cl.
| | |
|---|---|
| *H01R 12/53* | (2011.01) |
| *H01R 12/55* | (2011.01) |
| *H05K 1/14* | (2006.01) |
| *H01R 43/00* | (2006.01) |
| *H05K 1/02* | (2006.01) |

(52) U.S. Cl.
CPC ............. *H01R 12/53* (2013.01); *H01R 12/55* (2013.01); *H05K 1/144* (2013.01); *H01R 43/007* (2013.01); *H05K 1/0219* (2013.01);

*H05K 2201/0314* (2013.01); *H05K 2201/041* (2013.01); *H05K 2201/10356* (2013.01)

(58) Field of Classification Search
CPC ...... H01R 12/53; H01R 12/55; H01R 43/007; H05K 1/144; H05K 2201/0314; H05K 2201/041; H05K 2201/10356
USPC ........................................................ 439/660
See application file for complete search history.

(56) References Cited

U.S. PATENT DOCUMENTS

| | | | | |
|---|---|---|---|---|
| 6,176,743 B1 * | 1/2001 | Kuo | ..................... | H01R 12/523 |
| | | | | 439/654 |
| 6,386,913 B1 * | 5/2002 | Mohammad | ........... | H01R 24/50 |
| | | | | 439/579 |

(Continued)

FOREIGN PATENT DOCUMENTS

| | | |
|---|---|---|
| WO | 2017019051 A1 | 2/2017 |

*Primary Examiner* — Harshad C Patel
(74) *Attorney, Agent, or Firm* — Edell, Shapiro & Finnan, LLC

(57) ABSTRACT

In some aspects, the techniques described herein relate to an apparatus for connecting cables to Input Output (IO) connector pins, including: a first Printed Circuit Board (PCB) configured to receive terminal ends of a plurality of cables, wherein the terminal ends of the plurality of cables are electrically isolated from one another in the first PCB; a second PCB configured to receive a plurality of IO connector pins, wherein the plurality of IO connector pins are electrically isolated from one another in the second PCB; and wherein the first PCB is configured to join to the second PCB to connect each of the terminal ends of the plurality of cables to corresponding pins of the plurality of IO connector pins.

20 Claims, 20 Drawing Sheets

(56) References Cited

U.S. PATENT DOCUMENTS

| | | | | | |
|---|---|---|---|---|---|
| 6,547,593 | B1 * | 4/2003 | Beckous | ............... | H01R 24/50 |
| | | | | | 439/578 |
| 7,220,135 | B1 * | 5/2007 | Brekosky | ............ | H01R 12/523 |
| | | | | | 439/75 |
| 7,874,845 | B1 * | 1/2011 | Tang | .................. | H01R 12/7064 |
| | | | | | 439/65 |
| 8,202,121 | B2 * | 6/2012 | Nichols | ............... | H01R 13/025 |
| | | | | | 439/607.35 |
| 8,282,403 | B2 * | 10/2012 | Sawai | .................. | H01R 12/714 |
| | | | | | 439/79 |
| 8,888,519 | B2 * | 11/2014 | Baumler | ............ | H01R 13/6315 |
| | | | | | 439/248 |
| 9,048,569 | B2 * | 6/2015 | Chen | .................. | H01R 13/6275 |
| 9,318,824 | B2 * | 4/2016 | Hara | ....................... | H01R 12/75 |
| 10,653,000 | B2 * | 5/2020 | Lo | ........................ | H05K 1/0233 |
| 11,404,806 | B2 * | 8/2022 | Chen | ...................... | H01R 12/71 |
| 11,616,330 | B2 * | 3/2023 | Herring | ................ | H01R 12/585 |
| | | | | | 439/82 |
| 11,742,603 | B2 * | 8/2023 | Tsai | ........................ | G06F 1/183 |
| | | | | | 439/65 |
| 11,757,238 | B2 * | 9/2023 | Little | ................... | H01R 13/504 |
| | | | | | 439/386 |
| 11,804,669 | B2 * | 10/2023 | Komoto | ............ | H01R 13/5219 |
| 11,831,106 | B2 * | 11/2023 | Girard, Jr. | .......... | H01R 13/6592 |
| 2004/0029406 | A1 * | 2/2004 | Loveless | ................ | H01R 24/50 |
| | | | | | 439/63 |
| 2008/0084530 | A1 * | 4/2008 | Hirabayashi | ....... | H01R 12/7076 |
| | | | | | 349/150 |
| 2016/0218455 | A1 | 7/2016 | Sayre et al. | | |
| 2016/0337266 | A1 | 11/2016 | Hanna | | |
| 2021/0231891 | A1 | 7/2021 | Tittenhofer et al. | | |
| 2022/0299721 | A1 | 9/2022 | Zbinden et al. | | |
| 2022/0360005 | A1 | 11/2022 | Sapozhnikov et al. | | |
| 2025/0107055 | A1 * | 3/2025 | Ma | ........................ | H05K 1/023 |

* cited by examiner

FEXT

FEXT (db)

FREQ [GHz]

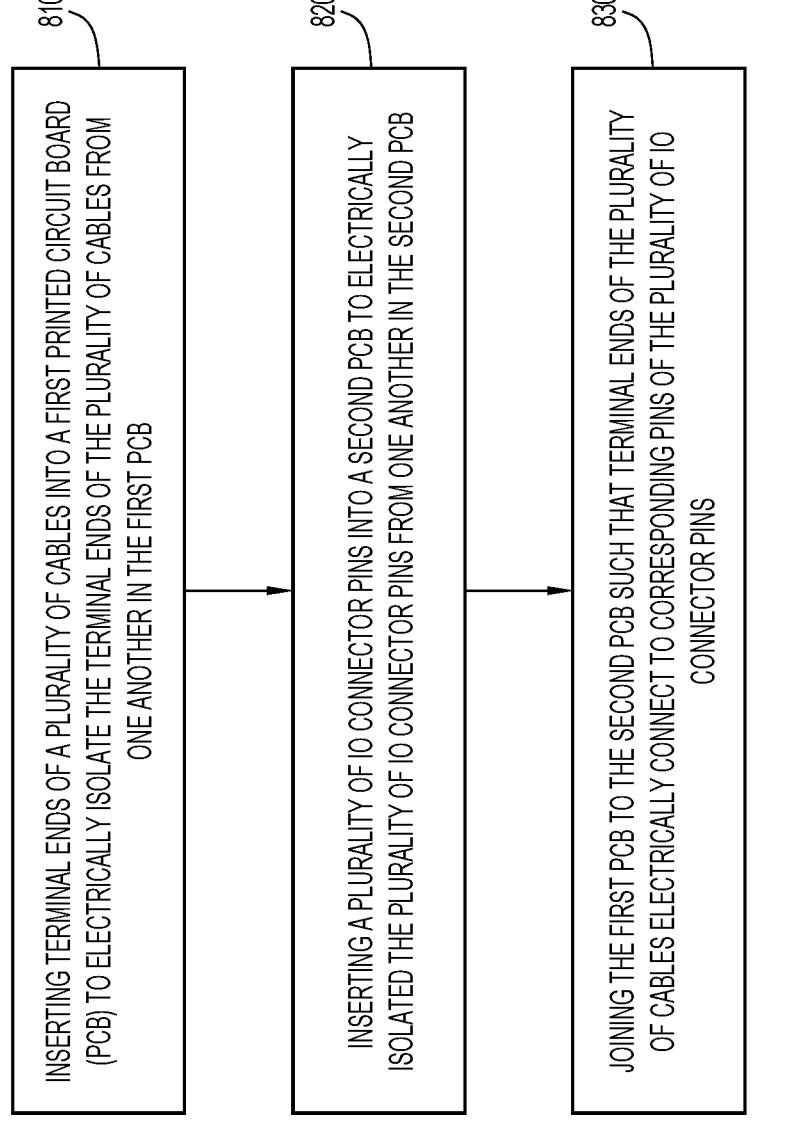

810

INSERTING TERMINAL ENDS OF A PLURALITY OF CABLES INTO A FIRST PRINTED CIRCUIT BOARD (PCB) TO ELECTRICALLY ISOLATE THE TERMINAL ENDS OF THE PLURALITY OF CABLES FROM ONE ANOTHER IN THE FIRST PCB

820

INSERTING A PLURALITY OF IO CONNECTOR PINS INTO A SECOND PCB TO ELECTRICALLY ISOLATED THE PLURALITY OF IO CONNECTOR PINS FROM ONE ANOTHER IN THE SECOND PCB

830

JOINING THE FIRST PCB TO THE SECOND PCB SUCH THAT TERMINAL ENDS OF THE PLURALITY OF CABLES ELECTRICALLY CONNECT TO CORRESPONDING PINS OF THE PLURALITY OF IO CONNECTOR PINS

TERMINATION OF CABLES FOR A CONNECTOR

CROSS-REFERENCE TO RELATED APPLICATIONS

This application claims the benefit of U.S. Provisional Patent Application No. 63/496,748, filed on Apr. 18, 2023, the contents of which are hereby incorporated by reference in their entirety.

TECHNICAL FIELD

The present disclosure relates to cable connections, such as cable connections in Small Form-Factor Pluggable modules.

BACKGROUND

A Small Form-factor Pluggable (SFP) module is a transceiver module or network interface module that can be a compact, hot-pluggable format used for both telecommunication and data communications applications. An SFP interface on networking hardware can be a modular slot for a media-specific transceiver, such as for a fiber-optic cable or a copper cable. SFP techniques may be used in place of modular connectors in Ethernet switches. Individual ports for SFP devices may be equipped with different types of transceivers as required. A Quad Speed Form-factor Pluggable (QSFP) network interface module may provide for four lanes compared to the one lane of an SFP interface. The additional lanes may provide for speeds 4 times a corresponding SFP interface. A Quad Speed Form-factor Pluggable-Double Density (QSFP-DD) network interface module may be built to\specifications that provide for a data transfer rate of 400 Gbit/s over eight lanes. The QSFP-DD network interface may use a form factor which is directly backwards compatible to the predecessor QSFP interfaces. With increasing speeds in network interface modules comes different challenges.

BRIEF DESCRIPTION OF THE DRAWINGS

FIG. 8 illustrates a flow chart for a method for assembling a network interface module, in accordance with techniques presented herein according to example embodiments.

DETAILED DESCRIPTION

Overview

Figure 1A:
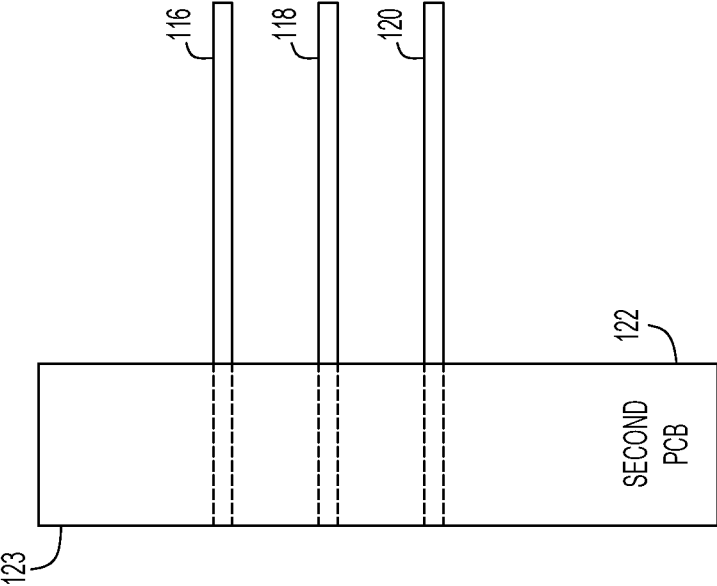
FIGS. 1A-C are block diagrams of side views of apparatuses for network interface modules, according to example embodiments.
Figure 1A:
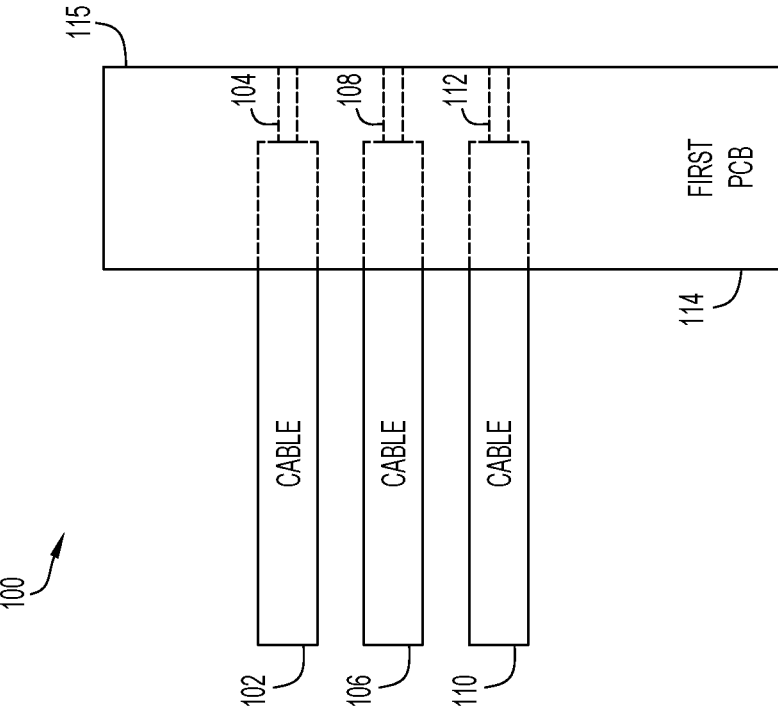

In some aspects, the techniques described herein relate to an apparatus for connecting cables to Input Output (IO) connector pins, including: a first Printed Circuit Board (PCB) configured to receive terminal ends of a plurality of cables, wherein the terminal ends of the plurality of cables are electrically isolated from one another in the first PCB; and a second PCB configured to receive a plurality of IO connector pins, wherein the plurality of IO connector pins are electrically isolated from one another in the second PCB, wherein the first PCB is configured to join to the second PCB to connect each of the terminal ends of the plurality of cables to corresponding pins of the plurality of IO connector pins.

In some aspects, the techniques described herein relate to a device for connecting cables to Input Output (IO) connector pins, including: a plurality of cables terminating in terminal ends; a housing for housing the plurality of cables; IO connectors terminating in a plurality of IO connector pins; an IO fixture for housing the plurality of IO connectors; a first Printed Circuit Board (PCB) configured to receive the terminal ends of the plurality of cables, wherein the terminal ends of the plurality of cables are electrically isolated from one another in the first PCB; and a second PCB configured to receive the plurality of IO connector pins, wherein the IO connector pins are electrically isolated from one another in the second PCB, wherein the first PCB is configured to join to the second PCB to connect each of the terminal ends of the plurality of cables to corresponding pins of the plurality of IO connector pins.

In some aspects, the techniques described herein relate to a method including: inserting terminal ends of a plurality of cables into a first Printed Circuit Board (PCB) to electrically isolate the terminal ends of the plurality of cables from one another in the first PCB; inserting a plurality of IO connector pins into a second PCB to electrically isolated the plurality of IO connector pins from one another in the second PCB; and joining the first PCB to the second PCB such that terminal ends of the plurality of cables electrically connect to corresponding pins of the plurality of IO connector pins.

Example Embodiments

The techniques presented herein describe the termination of cables for a connection using a first printed circuit board (PCB) for terminating the cables and a second PCB to receive Input Output (IO) connector pins. The connection is formed by joining the first PCB to the second PCB to connect terminal ends of the cables to corresponding IO connector pins. The embodiments presented herein may be employed in network interface modules or transceiver modules. Network interface modules for network interface devices, such as network switches, can include pluggable devices that can be described as hot-pluggable transceiver optics connectors. Such network interface modules may be used for both telecommunication and data communication applications and can include the following form factors: SFP, QSFP, QSFP-DD, and Octal Small Format Pluggable (OSFP).

High speed data rates, such as 112/224g data rates, utilizing high serializer/deserializer (serdes) counts for network interface modules have led to the increased use of flyover techniques. For example, flyover cables may be used to transmit signals over a PCB, as opposed to through the PCB, enabling the use of lower loss channel mediums. Flyover techniques, including flyover interconnect techniques, may have drawbacks. For example, a high speed termination of twinax cables, used in flyover techniques, to the input output (IO) connector pins of the network interface module using traditional paddle cards may not achieve performance thresholds. The use of paddle cards may also have drawbacks related to managing the cable assembly during the installation on both ends of the link (i.e., the Application Specific Integrated Circuit (ASIC) and IO connector ends of the link), the ability to fully test each individual segment prior to assembly, the ability to exchange one network interface module or design block for another, or reworking a pair of cables in the network interface module with the least amount of wasted material and time.

Example embodiments of the techniques presented herein may enable solutions to the drawbacks presented by traditional techniques, such as the use of paddle connectors in network interface modules. Presented herein are techniques that enable a connector for a network interface module to terminate a plurality of differential pairs of twinax cables into PCBs on both sides of the link. Twinax cable may be referred to as twinaxial cable or cabling. Twinax cables may include two inner conductors surrounded by a concentric conducting shield with an insulating material separating the inner conductors and the shield. The two inner conductors may form a twisted pair. The plurality of cables may be described as cable bundles and may be manufactured and fully tested prior to use in a network interface module. Using the techniques presented herein, if a given network interface module or a pair of twinax cables in a network interface module are not making a solid connection, the defective part may be fixed and retested during the early manufacturing phase, enabling higher yields.

The plurality of cables may terminate in a first PCB and the IO connector pins may terminate in a second PCB. Terminating the plurality of cables or a plurality of IO connectors pins in a PCB may be referred to as a termination bundle. Once the termination bundles are completed, the termination bundle for the plurality of cables can be inserted into the near ASIC fixture of the network interface module and the termination bundle for the IO connector pins can be inserted into an IO fixture of the network interface module. The first PCB and the second PCB may be joined together such that protrusions of the plurality of cables electrically contact corresponding IO connector pins. The first PCB and the second PCB may be joined together with a layer of elastomer between the first PCB and the second PCB. It should be appreciated that other connection techniques, such as soldering, may be used to join the first PCB and the second PCB.

The use of the first PCB and second PCB with an optional elastomer layer as an interconnect for the network interface module may makes handling and assembly of the network interface module easier and reduce manufacturing mistakes and/or damaging of the interconnect. The techniques presented herein may offer superior signal integrity (SI) as the protrusions of the twinax cables can be kept as close as possible to the terminations of the cables in the first PCB.

Turning to FIG. 1A, provided therein is a side view of an example embodiment of apparatus 100 of the techniques presented herein. The apparatus 100 includes cable 102 with protrusion 104, cable 106 with protrusion 108, cable 110 with protrusion 112, a first PCB 114 with a surface 115, an IO connector pin 116, an IO connector pin 118, an IO connector pin 120, and a second PCB 122 with a surface 123. The apparatus 100 can be an interconnect in a network interface module. The network interface module may implement any form factor including, but not limited to, SFP, OSFP, QSFP, and QSFP-DD form factors.

The cable 102, the cable 106, and the cable 110 form a plurality of cables that can be twinax cables or that can be fiber optic cables. The plurality of cables can connect to an ASIC on one end while the other end of the plurality of cables can terminate in the first PCB 114. The protrusion 104, the protrusion 108, and the protrusion 112 can be inner conductors of the respective cables that protrude from the insulation material and shield of the respective cables. The protrusion 104, the protrusion 108, and the protrusion 112 are separated from one another in openings in the first PCB 114 and electrically shielded within the first PCB 114. The protrusion 104, the protrusion 108, and the protrusion 112 extend through the openings of the first PCB and are exposed at the surface 115. The exposed portion of the protrusions may be flush with the surface 115 or extend past surface 115. The cable 102, the cable 106, and the cable 110 may each have two protrusions for twinax cables or may have more than two protrusions for other types of cables. The protrusion 104, the protrusion 108, and the protrusion 112 can be referred to as terminal ends of the respective cables.

An end of each of the IO connector pin 116, the IO connector pin 118, and the IO connector pin 120 terminates at the second PCB 122 with an opposite end of the connector pins ending in an IO fixture. The IO connector pin 116, the IO connector pin 118, and the IO connector pin 120 each pass through openings in the second PCB 122 and terminate at the surface 123 and can be exposed at the surface 123. The exposed portion of the connector pins can be flush with the surface 123 or extend past surface 123. The IO fixture can be a form factor configured to be received by a port on a network device. The protrusion 104, the protrusion 108, and the protrusion 112 correspond to the IO connector pin 116, the IO connector pin 118, and the IO connector pin 120, respectively, by joining together the first PCB 114 and the second PCB 122. For example, the surface 115 can be joined to the surface 123. In related art techniques, protrusions of cables with IO connector pins joined without the first PCB 114 and the second PCB 122 resulted in connections that were not electrically shielded, leading to signal loss.

Figure 1B:
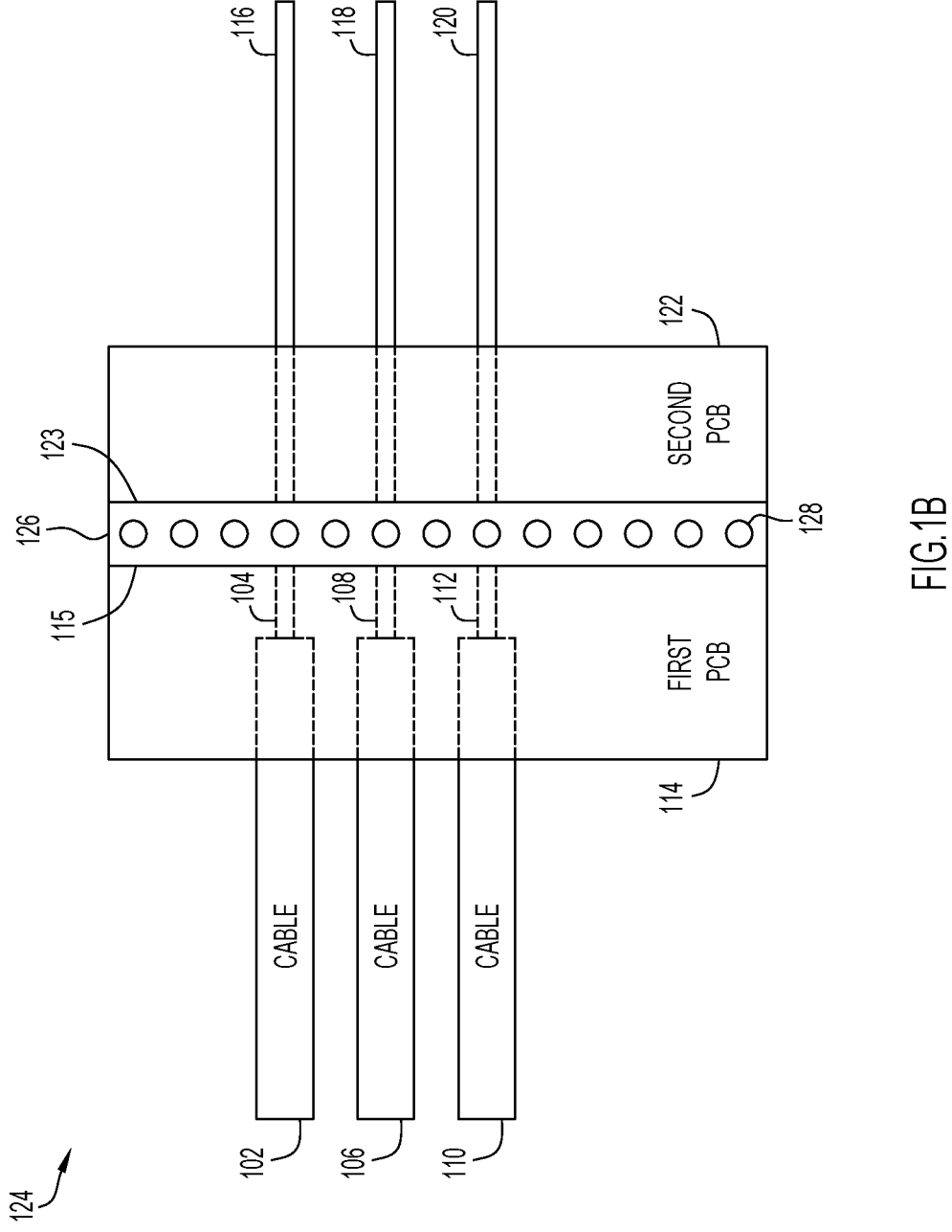

FIG. 1B depicts a side view of an example embodiment of apparatus 124 of the techniques presented herein. The apparatus 124 may include the features and components of the apparatus 100 of FIG. 1A. Apparatus 124 includes an elastomer layer 126 positioned between the first PCB 114 and the second PCB 122. The elastomer layer 126 can be a thin layer of elastomer material. For example, the elastomer layer may be between 0.05 mm and 0.4 mm, inclusive. The elastomer layer 126 can be impregnated with metal particles 128. The metal particles 128 can provide electrical contact between a protrusion of a cable with a corresponding IO connector pin. The metal particles 128 are depicted in FIG. 1B with one metal particle between each corresponding protrusion and IO connector pin. However, more than one metal particle may be used to electrically connect a protrusion to an IO connector pin. The surface 115 and the surface 123 may contact opposite sides of the elastomer layer 126. Pressure may be employed to maintain contact of the first PCB 114 and the second PCB 122 with the elastomer layer 126. For example, the apparatus 124 may be placed in a network interface module that has slots, grooves, or other structural features that hold the first PCB 114 and the second PCB 122 in place while maintaining pressure against the elastomer layer 126. The elastomer layer 126 can allow for some movement and flexibility of the first PCB 114 relative to the second PCB 122 after being joined together. The pressure applied to the elastomer layer 126 may compress the layer in the assembled state.

Figure 1C:
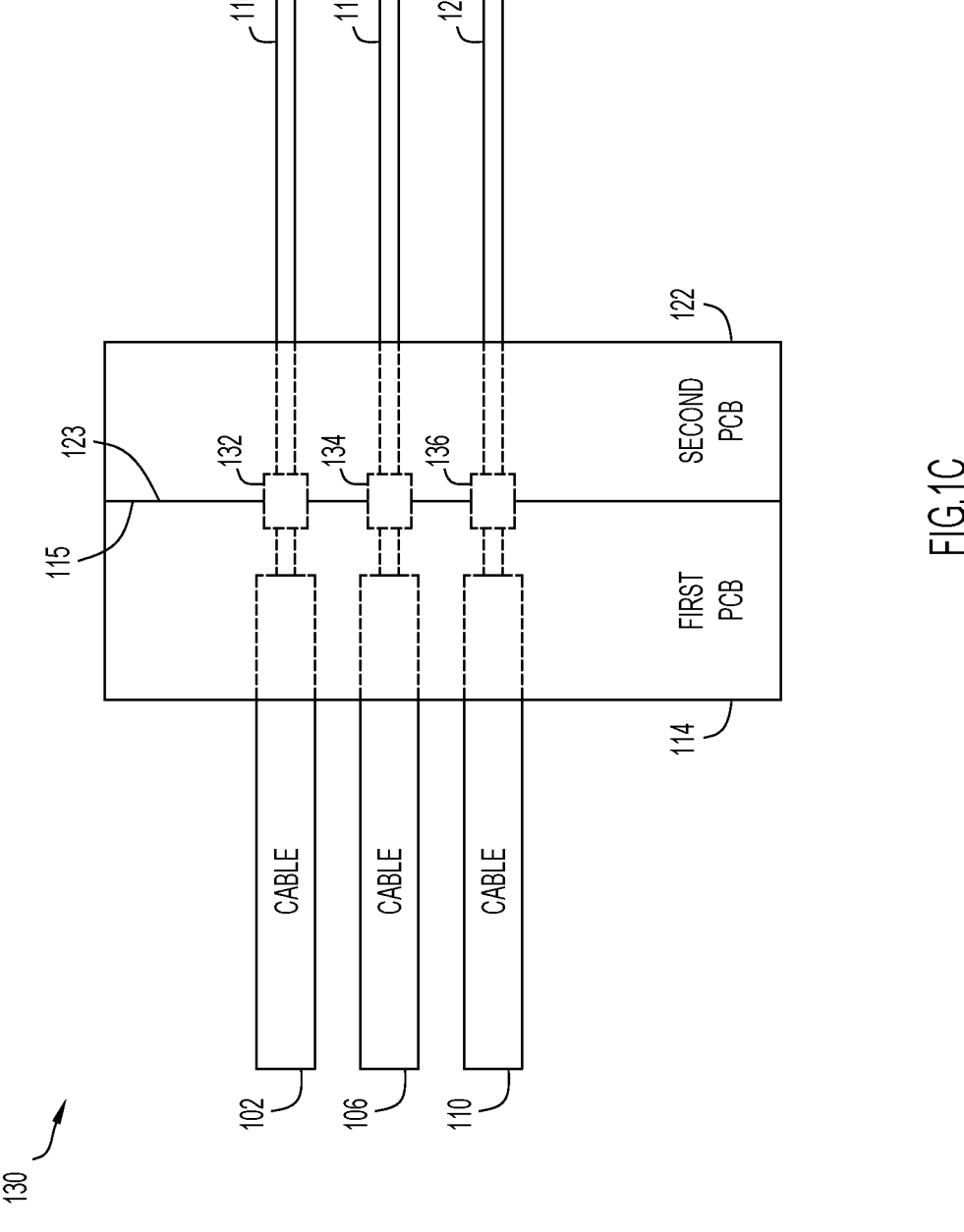

FIG. 1C depicts a side view of an example embodiment of apparatus 130 of the techniques presented herein. The apparatus 130 may include the features and components of the apparatus 100 of FIG. 1A. The apparatus 130 includes a solder joint 132, a solder joint 134, and a solder joint 136. In one embodiment, the surface 115 of the first PCB 114 can be joined to the surface 123 of the second PCB 122 and the solder joint 132, the solder joint 134, and the solder joint 136 can be used to electrically couple the cable 102 to the IO connector pin 116, the cable 106 to the IO connector pin 118, and the cable 110 to the IO connector pin 120, respectively. The solder joints can be described as solder connections or solder vias.

Figure 2A:
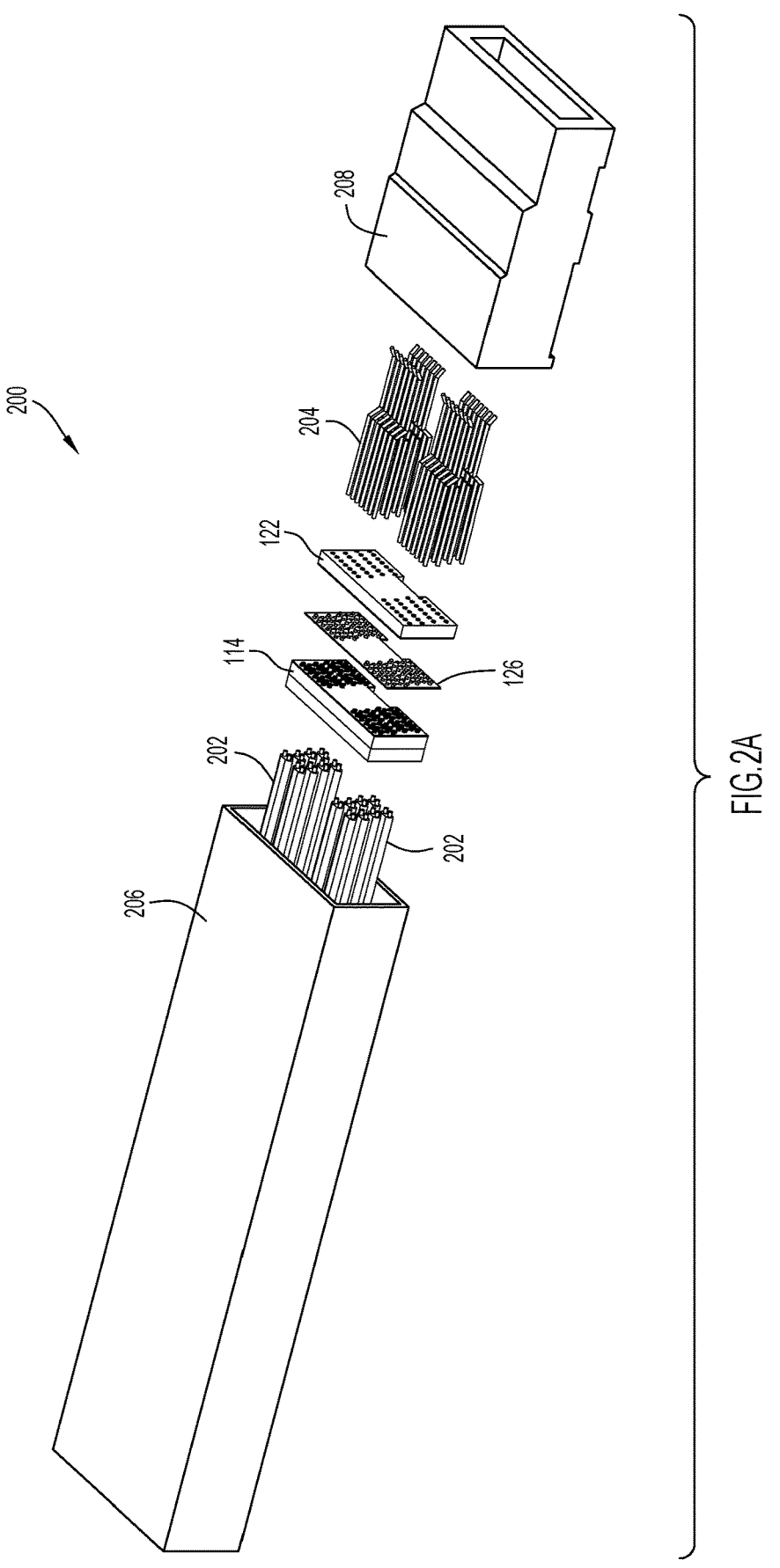
FIG. 2A depicts a three-dimensional exploded diagram of a system for a network interface module, in accordance with techniques presented herein according to example embodiments.

Turning now to FIG. 2A, illustrated therein is a three-dimensional exploded diagram of a system 200 in accordance with techniques presented herein. The system 200 can include the features and components of one or more of FIGS. 1A-C. The system 200 can include the first PCB 114, the second PCB 122, the elastomer layer 126, cables 202, IO connector pins 204, a housing 206, and an IO fixture 208.

The cables 202 can be a plurality of cables and can be the same as the cable 102, the cable 106, and the cable 110 of FIG. 1A. The cables 202 are depicted as twinax cables but can be other types of cables, including fiber optic cables. The IO connector pins 204 can be the same as the IO connector pin 116, the IO connector pin 118, and the IO connector pin 120 of FIG. 1A. It should be appreciated that cables 202 can include any number of cables and IO connector pins 204 can include any number of pins.

The system 200 can be a part of a network interface module that can be any form factor including, but not limited to, SFP, OSFP, QSFP, and QSFP-DD form factors. One end of the cables 202 can end in an ASIC fixture while the other ends of the cables 202 terminate in the first PCB 114. The ASIC fixture can be housed in the housing 206. The housing 206 can be a metal cage or can be composed of other materials. The housing 206 can be a cage configured to be compatible with the QSFP-DD form factor. The IO connector pins 204 can have one end that terminates in the second PCB 122 while the other ends of the IO connector pins 204 terminate in the IO fixture 208. The IO fixture 208 can be a network connector where the other ends of the IO connector pins 204 are exposed in the network connector. The network connector can be configured to be received by a port of a network device such as a network switch where the exposed portions of the IO connector pins 204 can make contact with portions of the port. The IO fixture 208 can be a QSFP-DD connector. The IO fixture 208 can be described as a cage and can be composed of plastic or other materials.

Figure 2B:
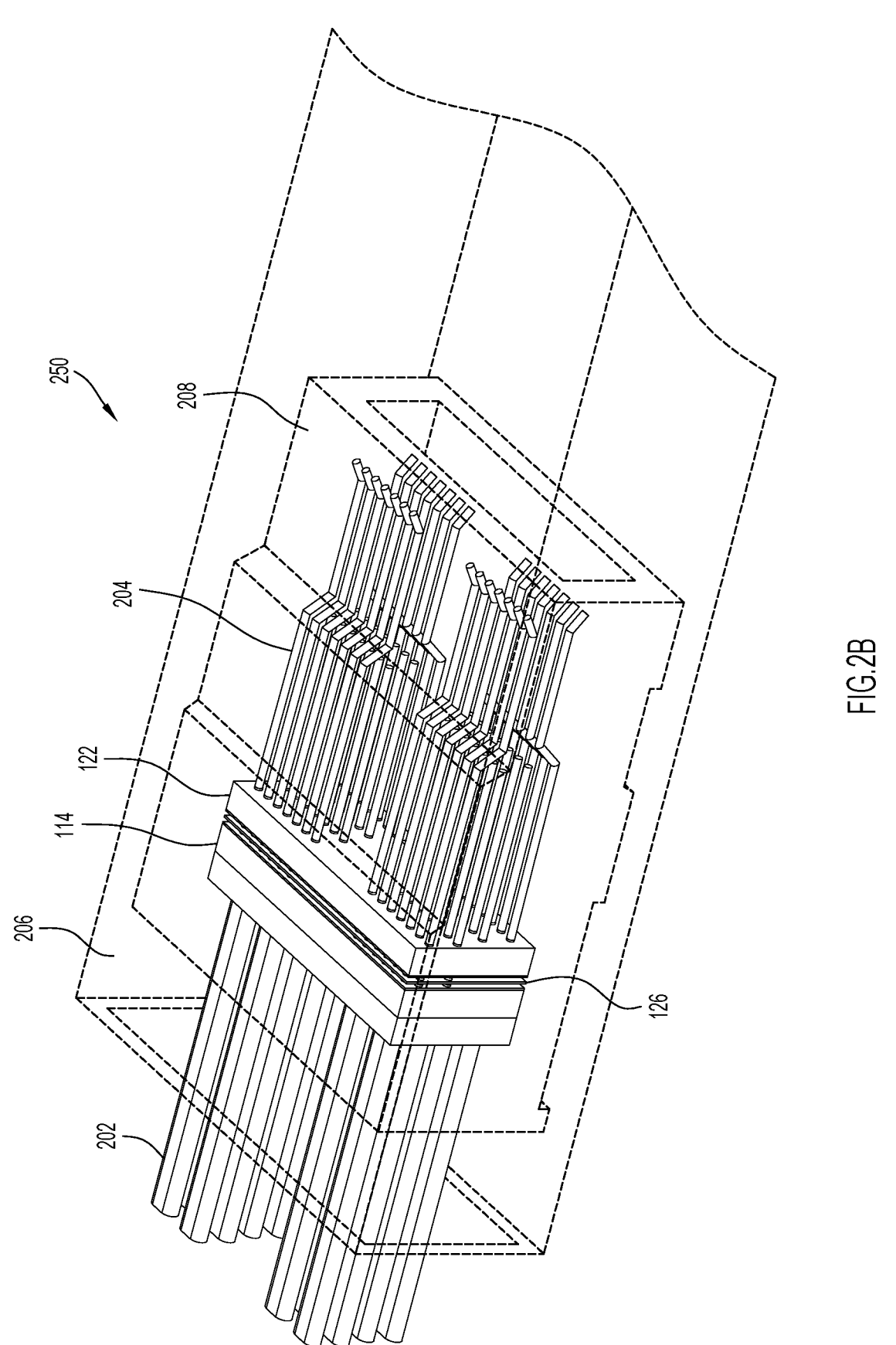
FIG. 2B depicts a three-dimensional diagram of a system for a network interface module, in accordance with techniques presented herein according to example embodiments.

FIG. 2B depicts a three-dimensional diagram of a system 250. The system 250 provides a close-up view of the components of system 200 of FIG. 2A in an assembled state. For example, the first PCB 114 has been joined to the second PCB 122 with the elastomer layer 126 in between.

Figure 2C:
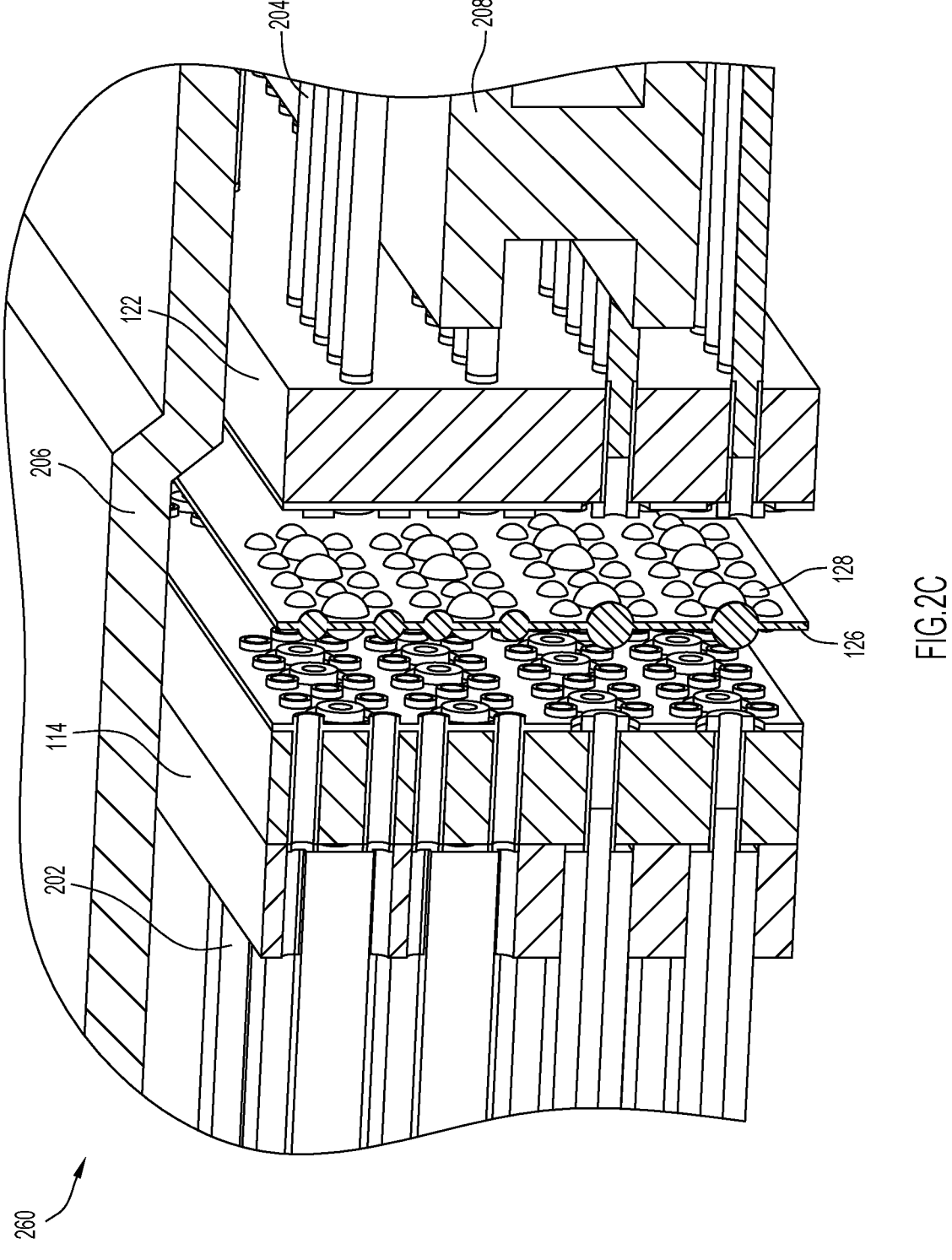
FIG. 2C depicts a cross-sectional three-dimensional diagram of a system for a network interface module, in accordance with techniques presented herein according to example embodiments.

FIG. 2C depicts a cross-sectional three-dimensional diagram of a system 260. The system 260 provides a close-up view of the components of system 200 of FIG. 2A before the first PCB 114 has been joined to the second PCB 122 with the elastomer layer 126, impregnated with the metal particles 128, in between.

Figure 2D:
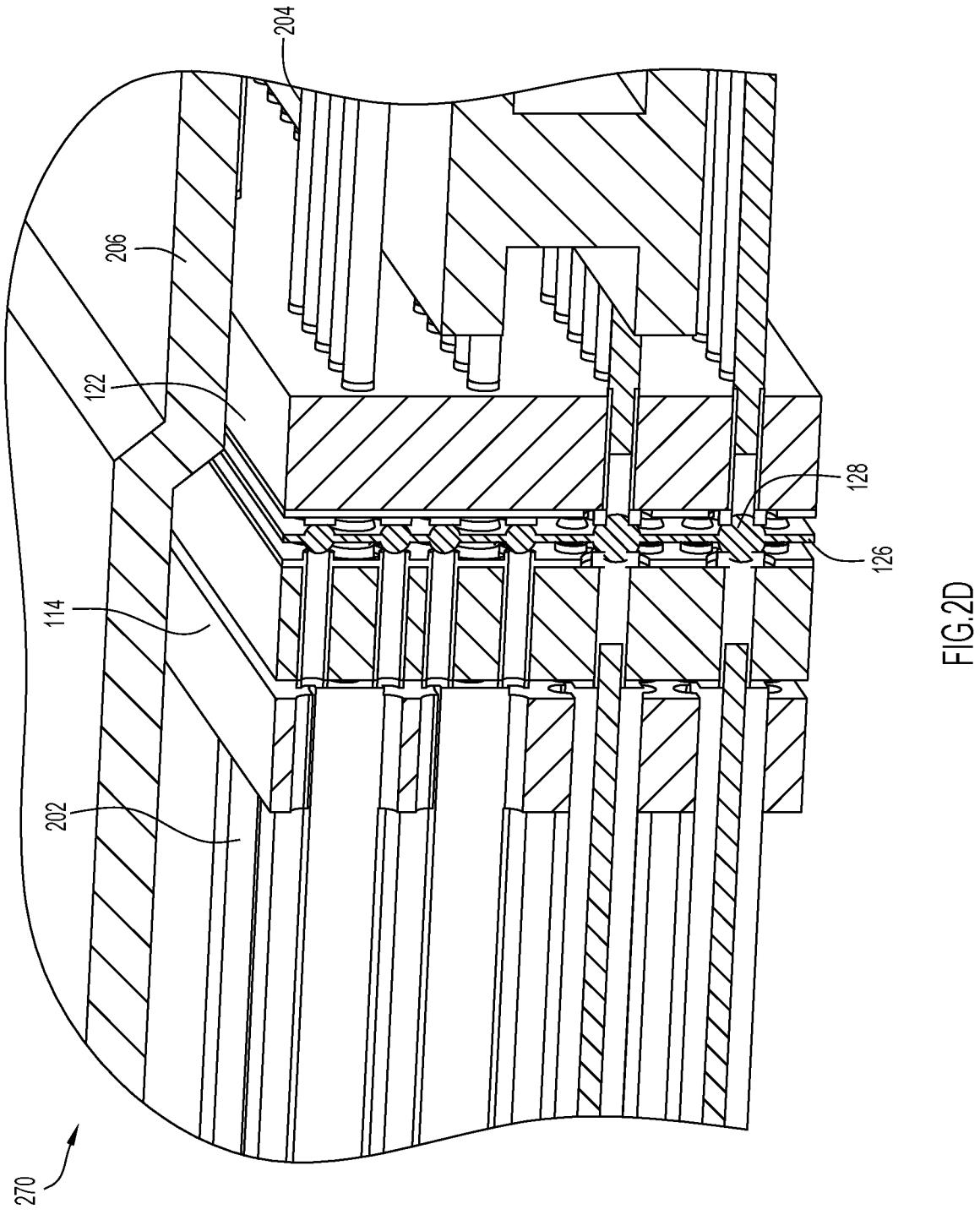
FIG. 2D depicts a cross-sectional three-dimensional diagram of a system for a network interface module, in accordance with techniques presented herein according to example embodiments.

FIG. 2D depicts a cross-sectional three-dimensional diagram of a system 270. The system 270 provides a close-up view of the components of system 200 of FIG. 2A after the first PCB 114 has been joined to the second PCB 122 with the elastomer layer 126, impregnated with the metal particles 128, in between.

Figure 3A:
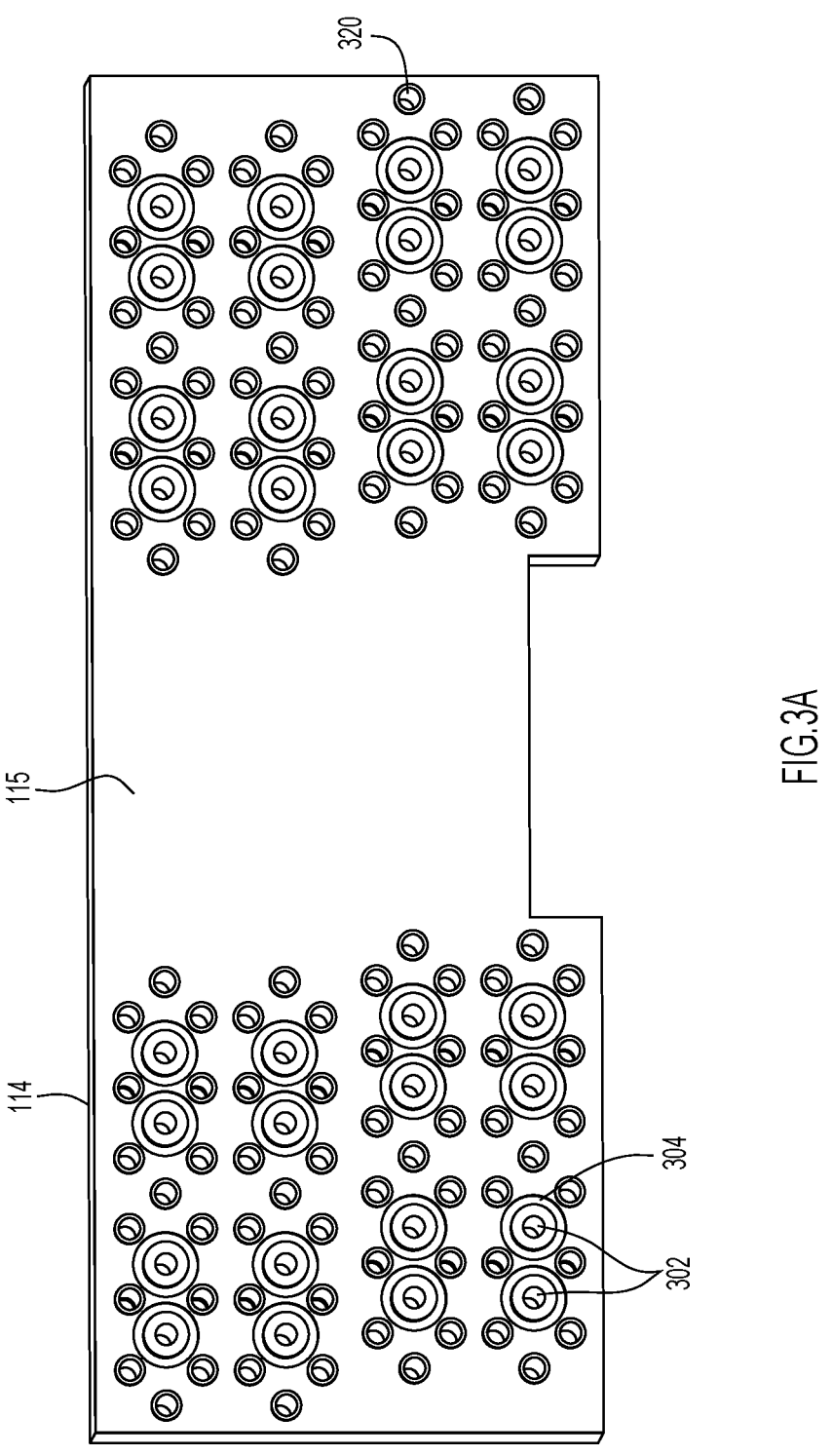
FIG. 3A is a front view of a first PCB for a network interface module, in accordance with techniques presented herein according to example embodiments.

FIG. 3A is a front view of the first PCB 114 depicting the surface 115. The first PCB 114 includes openings 302 that allow for the protrusions or terminal ends of the cables to pass through first PCB 114 and be exposed at the surface 115. The first PCB 114 can include any number of openings. The openings 302 depict two openings that can correspond to the two inner conductors of a twinax cable. The first PCB 114 also includes a ring 304 around one of the openings 302. Each of the openings of the first PCB 114 can have a ring similar to the ring 304. The ring 304 can be composed of an insulating material that can electrically isolate the exposed portion of a protrusion of a cable that passes through one of the openings of the first PCB 114 from other protrusions that pass through other openings of first PCB 114. The insulating material can be an exposed insulating layer of the first PCB 114. Electrically isolating the exposed portion of a protrusion of a cable can prevent cross talk between the different protrusions of cables. Also illustrated in FIG. 3A are vias 320. Vias 320 may pass through first PCB 114 to provide ground structures through first PCB 114. Vias 320 may be electrically connected to corresponding vias 420 (illustrated in FIG. 4A). For example, vias 320 may be connected to vias 420 through elastomer layer 126 (illustrated in FIGS. 2A-2D) or using solder connections.

Figure 3B:
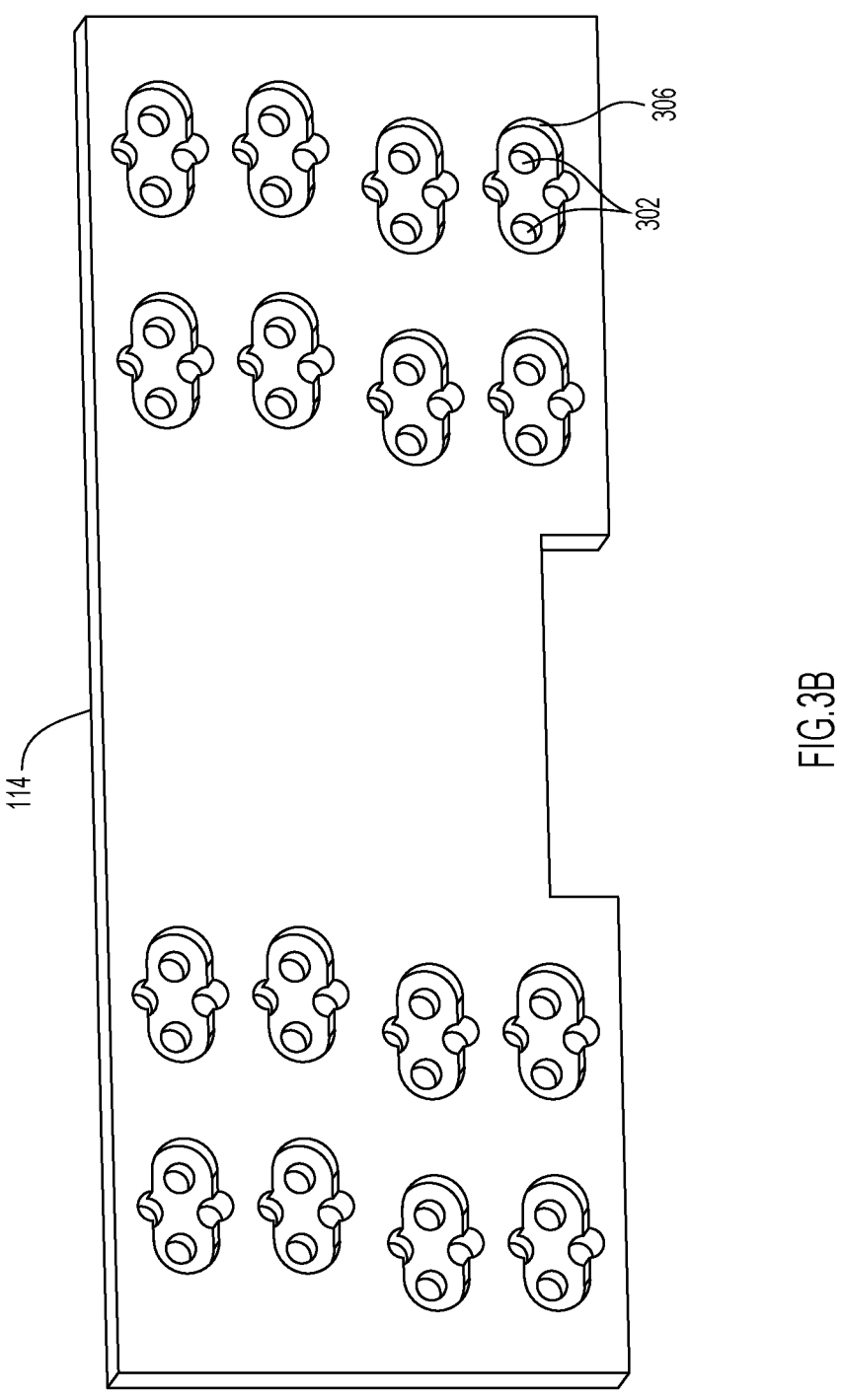
FIG. 3B is a back view of the first PCB for a network interface module, in accordance with techniques presented herein according to example embodiments.

FIG. 3B is a back view of the first PCB 114 which depicts a surface opposite of the surface 115. FIG. 3B depicts the openings 302 in the first PCB 114 as well as slot 306. The first PCB 114 can include any number of slots. For example, the first PCB 114 can include one slot for every cable that terminates at the first PCB 114. The slot 306 can be described as a slot or indentation in the first PCB 114 that does not pass all the way through the first PCB 114. The slot 306 can be configured to receive a portion of the cable that terminates at the first PCB 114. For example, the cables that terminate at the first PCB 114 can be surrounded in an outer portion, such as insulation or other materials, but have a protrusions of one or more inner conductors protruding out of the terminal end. The slot 306 can be configured to receive the outer portion of the cable while the protrusions pass through the openings 302. FIG. 3B depicts the slot 306 with two openings that correspond to a twinax cable with two inner conductors protruding. It should be appreciated that the first PCB 114 can also be configured to have one slot corresponding to one opening.

Figure 3C:
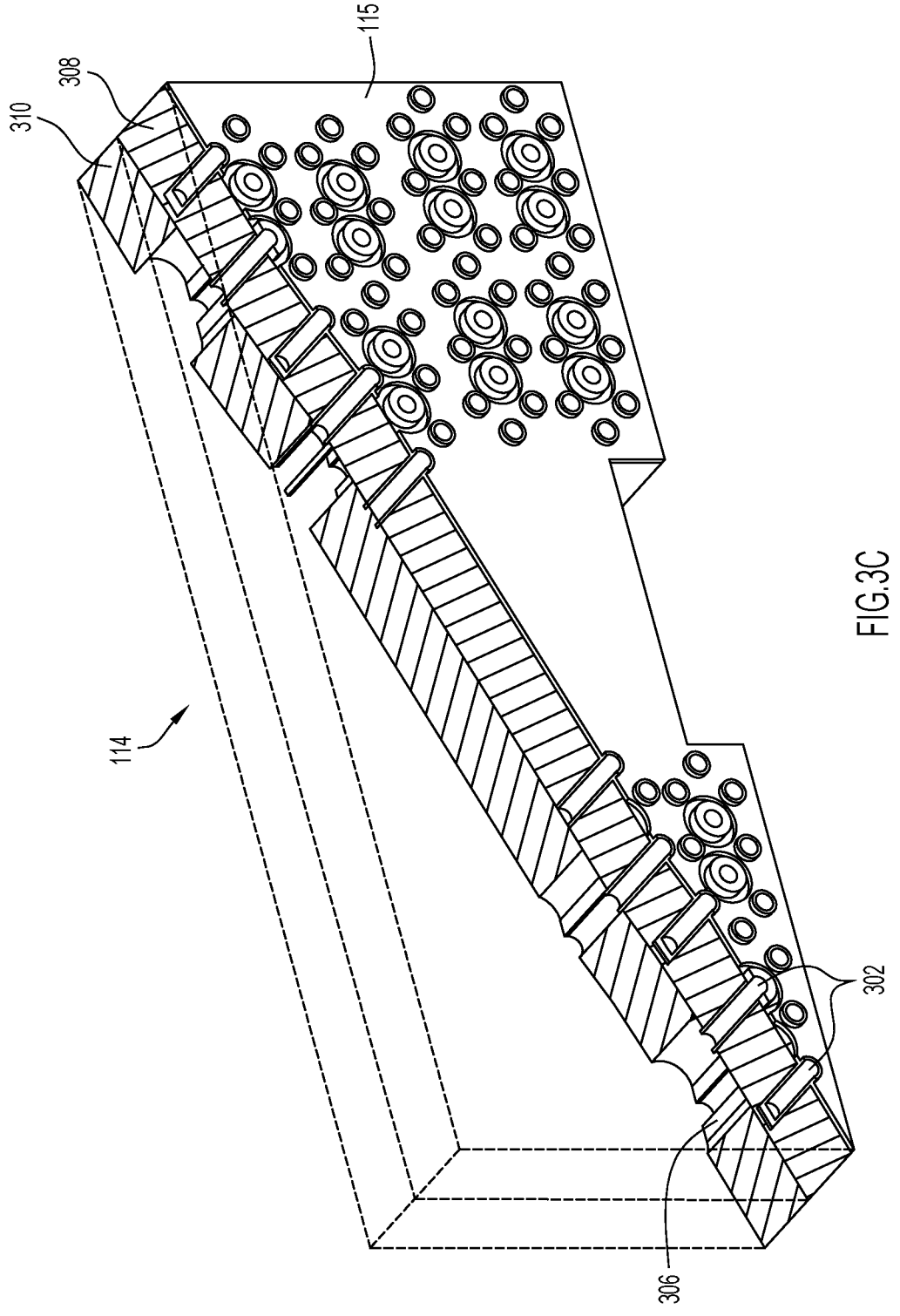
FIG. 3C is a three-dimensional cross section view of the first PCB for a network interface module, in accordance with techniques presented herein according to example embodiments.

FIG. 3C is a three-dimensional cross section view of the first PCB 114. FIG. 3C depicts the first PCB 114 as being formed from a first layer 308 and a second layer 310. The first layer 308 can be formed with the openings 302 while the second layer 310 can be formed with the slot 306.

Figure 3D:
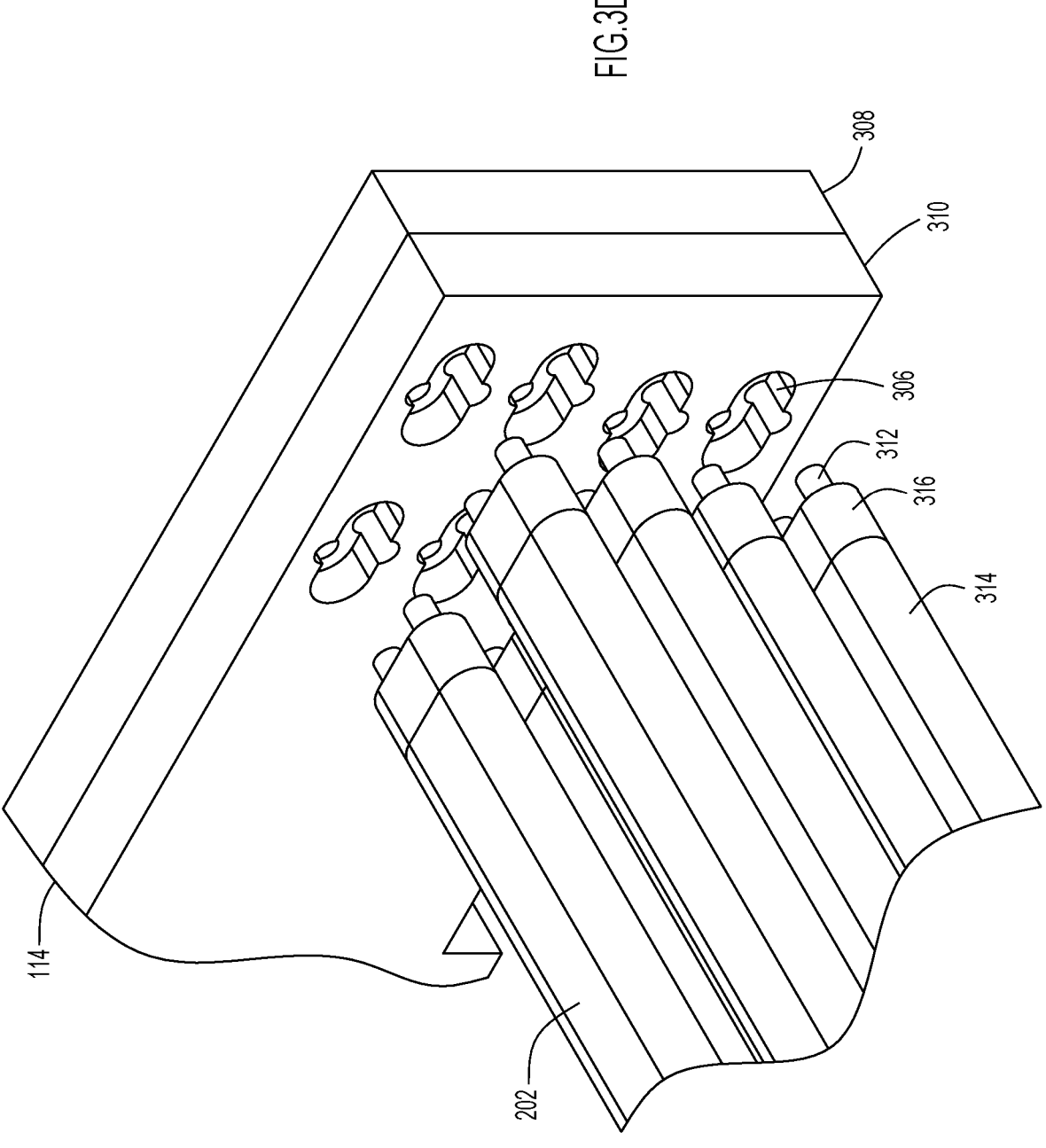
FIG. 3D is a three-dimensional back view of the first PCB before inserting cables for a network interface module, in accordance with techniques presented herein according to example embodiments.

FIG. 3D is a three-dimensional back view of the first PCB 114 and the cables 202 before the cables 202 are terminated in the first PCB 114. The cables 202 each include protrusions 312. The cables 202 each include an outer portion 314 that can be composed of an electrically insulating material. The cables 202 each include a concentric conducting shield that is covered by the outer portion 314. An exposed portion 316 of the concentric conducting shield can be exposed at the terminal end of each of the cables.

Figure 3E:
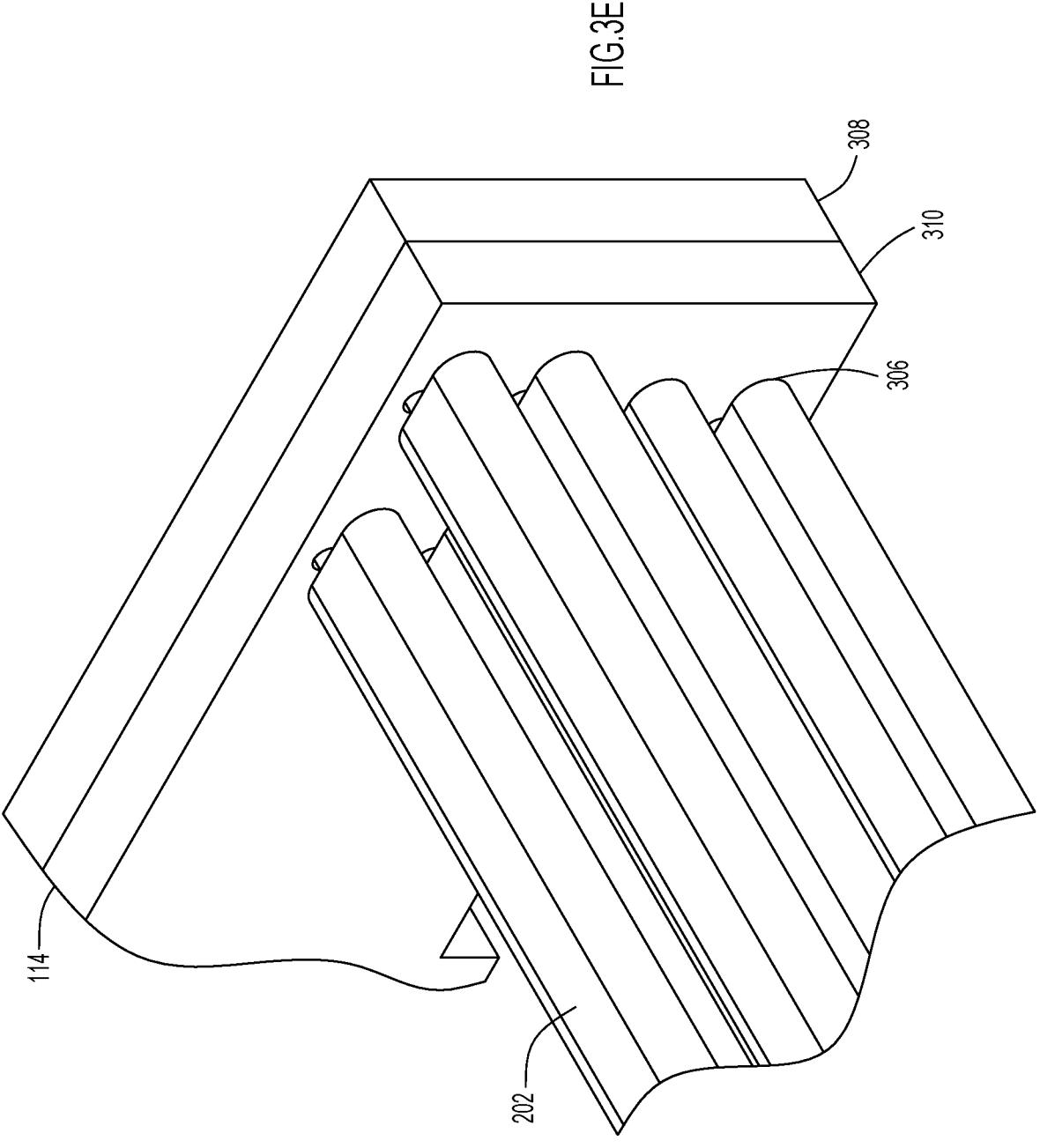
FIG. 3E is a three-dimensional back view of the first PCB after inserting cables for a network interface module, in accordance with techniques presented herein according to example embodiments.

FIG. 3E is a three-dimensional back view of the first PCB 114 and the cables 202 after the cables 202 have been terminated in the slots of first PCB 114. FIG. 3E depicts cable 202 in the slot 306 such that the exposed portion 316 is fully inserted into the slot 306 while the outer portion 314 remains arranged outside first PCB 114. The exposed portion 316 can be in electrical contact with exposed portions of the slot 306 and thus in electrical contact with portions of the first PCB 114. The exposed portions of the slot 306 in electrical contact with the exposed portion 316 of the cables 202 can be described as a grounding structure of the first PCB 114 and the exposed portion 316 of the cable can be described as an exposed shield portion.

Figure 4A:
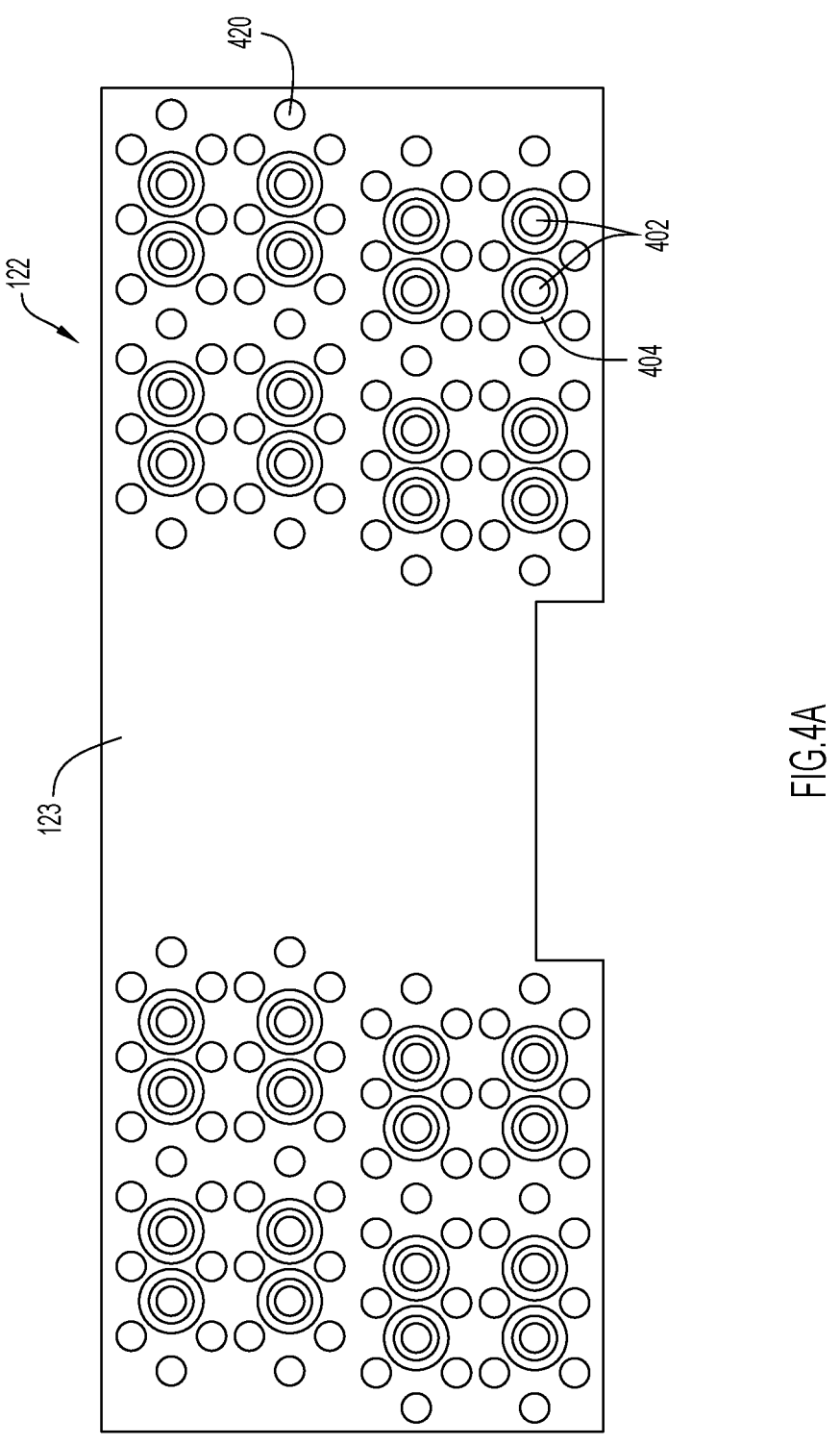
FIG. 4A is a front view of a second PCB for a network interface module, in accordance with techniques presented herein according to example embodiments.

FIG. 4A is a front view of the second PCB 122 depicting the surface 123. FIG. 4A depicts the openings 402 in the second PCB 122. The openings 402 can allow for ends of IO connector pins to pass through the second PCB 122 to the surface 123. The second PCB 122 can have any number of openings to support any number of IO connector pins.

The second PCB 122 includes ring 404 around the opening 402. Each of the openings of the second PCB 122 can have a ring similar to the ring 404. The ring 404 can be composed of an insulating material that can electrically isolate the exposed portion of an IO connector pin that passes through one of the openings of the second PCB 122 from other connector pins that pass through other openings of second PCB 122. The insulating material can be an exposed insulating layer of the second PCB 122. Electrically isolating the exposed portion of a connector pin can prevent cross talk between the connector pins.

Also illustrated in FIG. 4A are vias 420 formed in second PCB 122. As discussed above with reference to FIG. 3A, vias 420 may be electrically connected to corresponding vias 320 (illustrated in FIG. 3A). For example, vias 420 may be connected to vias 320 through elastomer layer 126 (illustrated in FIGS. 2A-2D) or using solder connections.

Figure 4B:
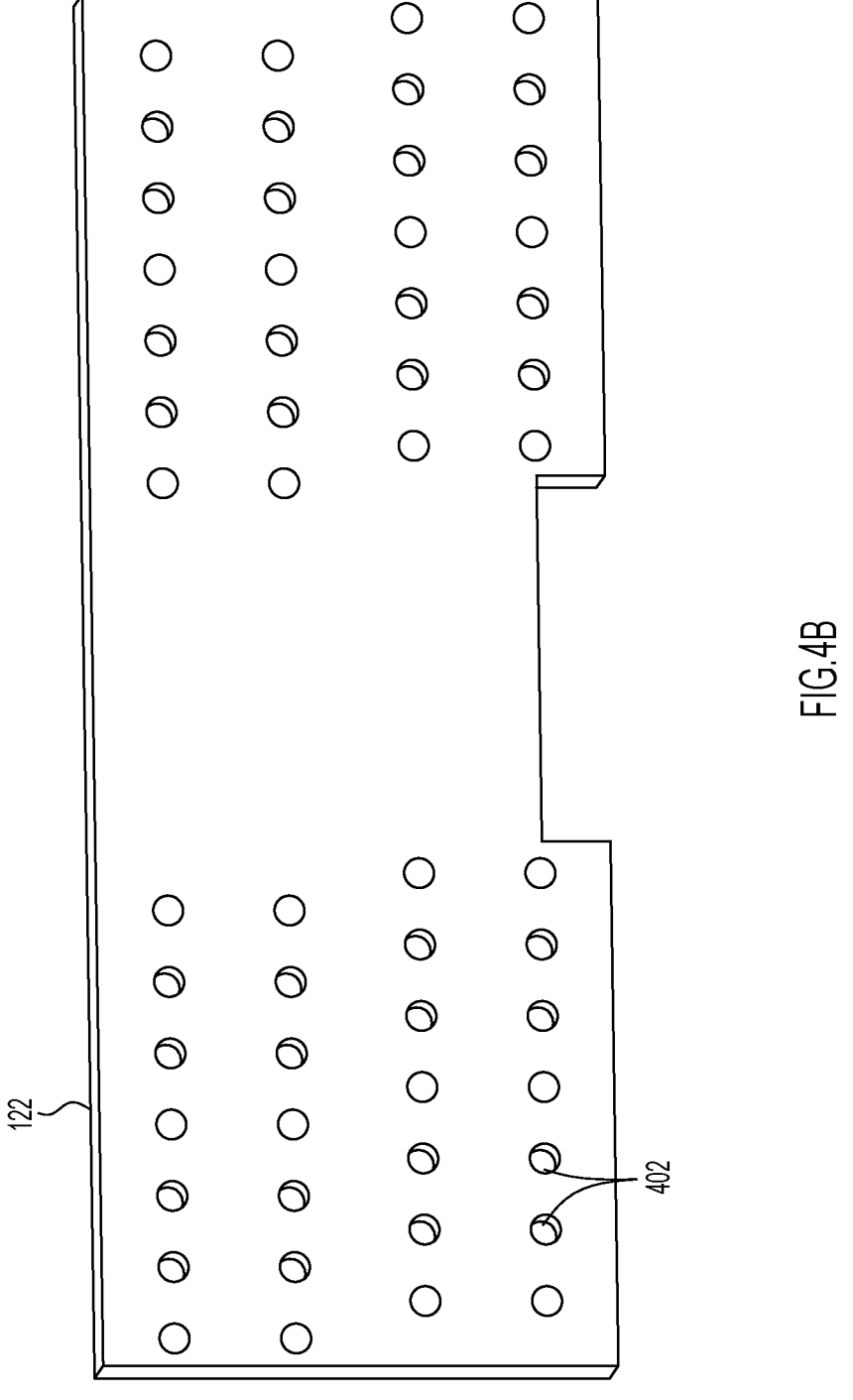
FIG. 4B is a back view of a second PCB for a network interface module, in accordance with techniques presented herein according to example embodiments.

FIG. 4B is a back view of the second PCB 122 depicting a surface opposite of the surface 123. FIG. 4B depicts the openings 402.

Figure 4C:
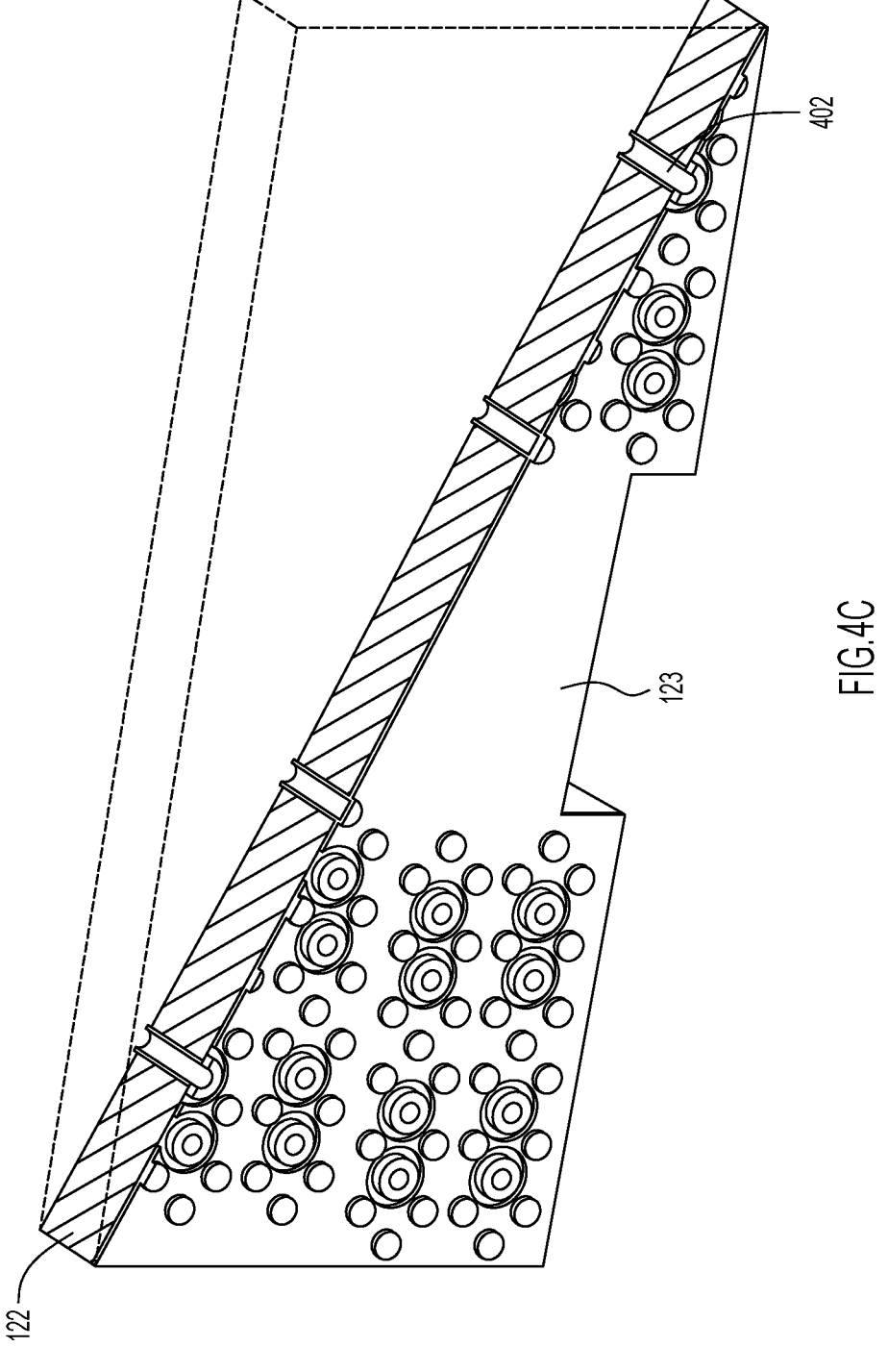
FIG. 4C is a three-dimensional cross section view of the second PCB for a network interface module, in accordance with techniques presented herein according to example embodiments.

FIG. 4C is a three-dimensional cross section view of the second PCB 122. FIG. 4C depicts the second PCB 122 with openings, such as one of the openings 402 passing all the way through the second PCB 122.

Figure 4D:
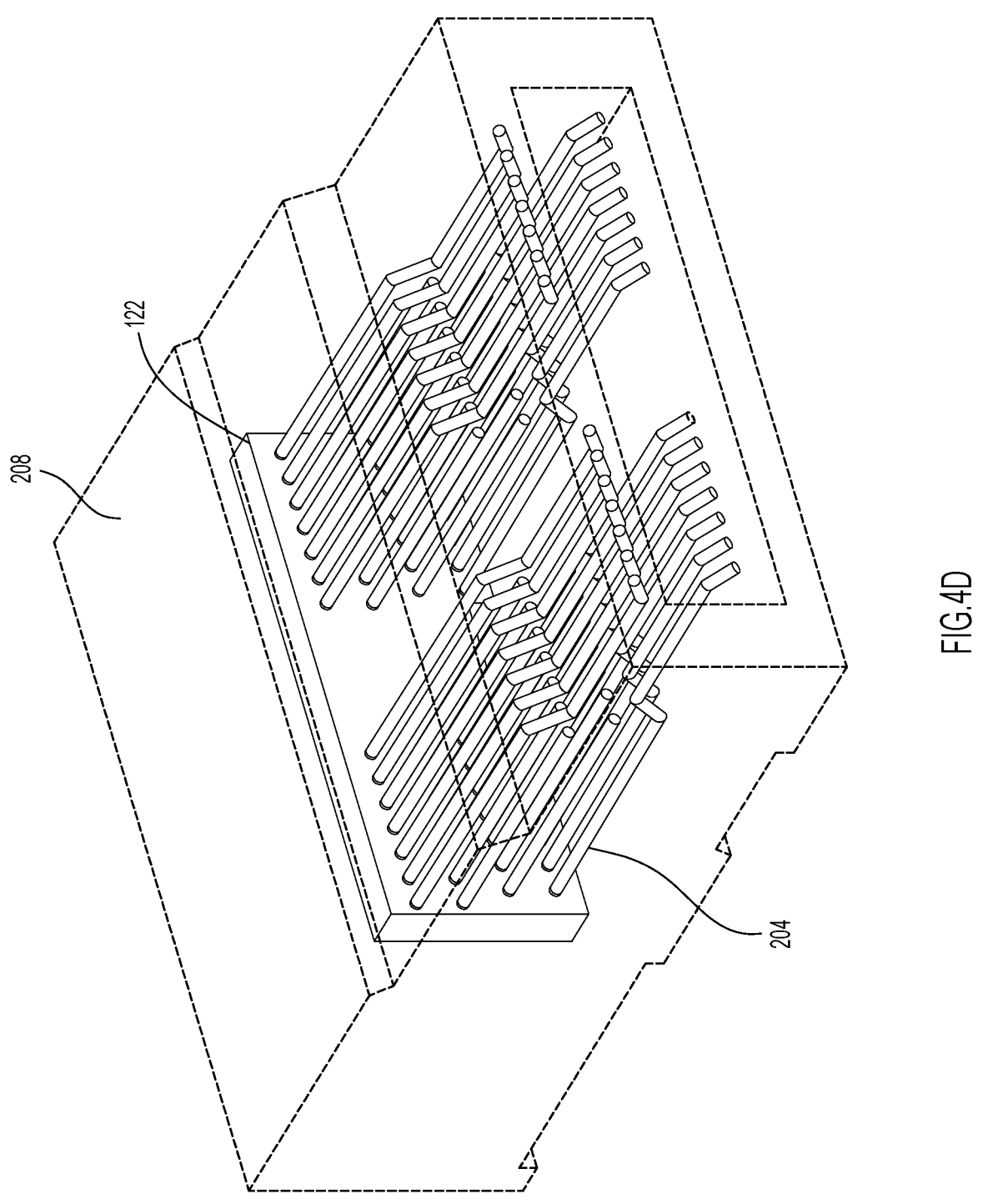
FIG. 4D is a three-dimensional back view of the second PCB with the IO connector pins and IO fixture for a network interface module, in accordance with techniques presented herein according to example embodiments.

FIG. 4D is a three-dimensional back view of the second PCB 122 and the IO connector pins 204 after the IO connector pins 204 have been terminated in the second PCB 122. The second PCB 122 and the IO connector pins 204 are depicted as located in the IO fixture 208.

Figure 5:
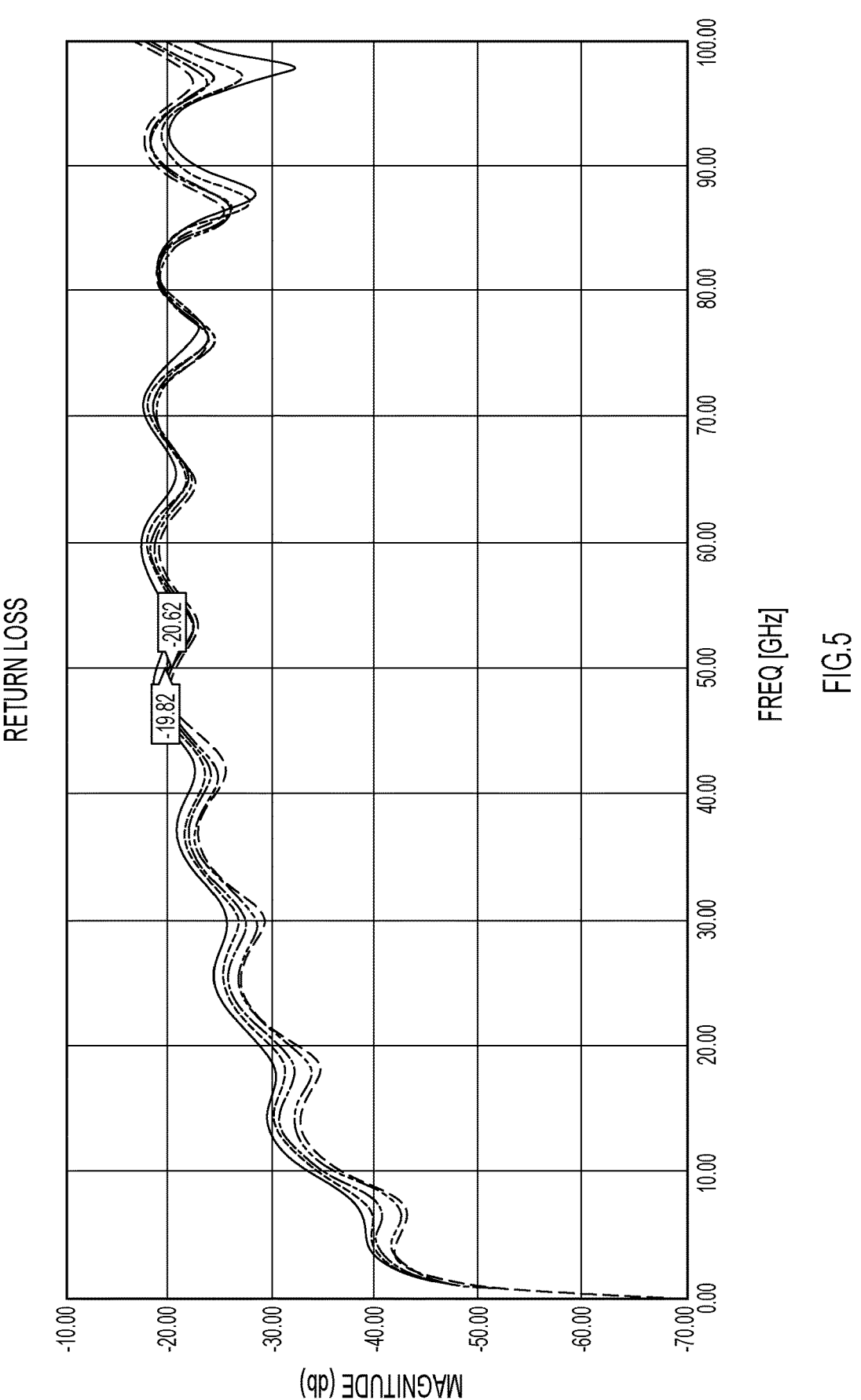
FIG. 5 is a graph that depicts Return Loss (RL) for embodiments of network interface modules, in accordance with techniques presented herein according to example embodiments.
Figure 6:
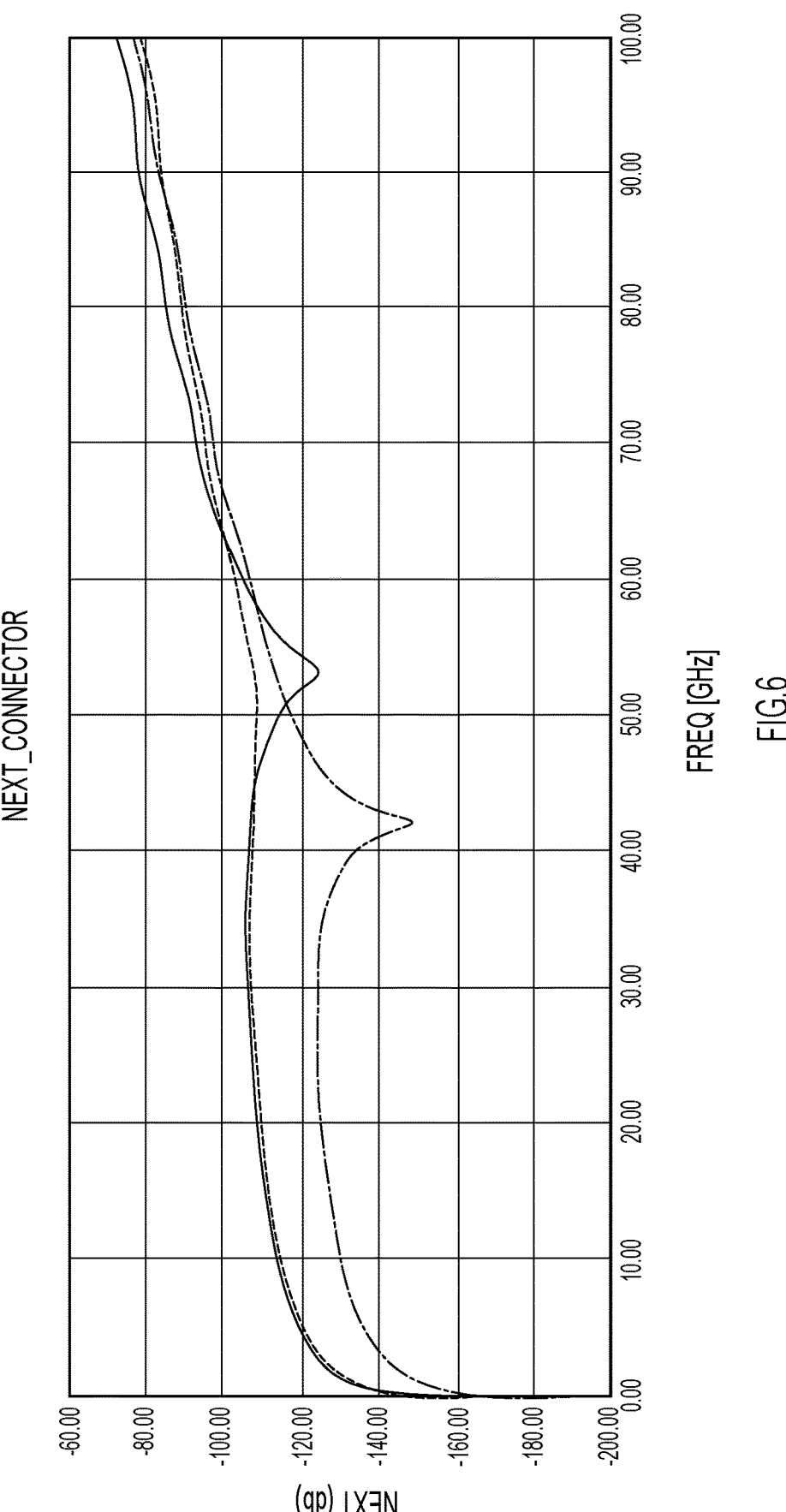
FIG. 6 provides a graph of near end crosstalk (NEXT) for multiple channels of an example network interface module, in accordance with techniques presented herein according to example embodiments.
Figure 7:
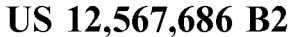
FIG. 7 provides a graph of far end crosstalk (FEXT) for multiple channels of an example network interface module, in accordance with techniques presented herein according to example embodiments.

FIGS. 5, 6 and 7 are graphs illustrating example return loss, NEXT and FEXT plots for embodiments of network interface modules according to the disclosed techniques. As illustrated in these graphs, the disclosed techniques provide performance sufficient to meet many use cases, such as devices implementing 112/224g data rates.

Turning to FIG. 8, illustrated therein is a flow chart for a method 800 for assembling, for example, a network interface module, according to the disclosed techniques. Method 800 may be applied to processes for assembling any of the network interface modules, transceiver modules, apparatuses, devices, or systems presented herein, as well as others known to the skilled artisan. The method 800 includes, at step 810, inserting terminal ends of a plurality of cables into a first Printed Circuit Board (PCB) to electrically isolate the terminal ends of the plurality of cables from one another in the first PCB. The method 800 further includes, at step 820, inserting a plurality of IO connector pins into a second PCB to electrically isolated the plurality of IO connector pins from one another in the second PCB. The method 800 further includes, at step 830, joining the first PCB to the second PCB such that terminal ends of the plurality of cables electrically connect to corresponding pins of the plurality of IO connector pins. The method can further include inserting a thin elastomer layer impregnated with metal conductive particles between the first PCB and the second PCB before joining the first PCB to the second PCB. According to other embodiments, method 800 can include operations such that solder is used to electrically connect the terminal ends of the plurality of cables to corresponding pins of the plurality of IO connector pins. In summary, the advantages of the disclosed network interface modules according to the disclosed techniques include improved signal integrity performance as well as improved manufacturing and system integration.

Accordingly, in some aspects, the techniques described herein relate to an apparatus for connecting cables to Input Output (IO) connector pins, including: a first Printed Circuit Board (PCB) configured to receive terminal ends of a plurality of cables, wherein the terminal ends of the plurality of cables are electrically isolated from one another in the first PCB; and a second PCB configured to receive a plurality of IO connector pins, wherein the plurality of IO connector pins are electrically isolated from one another in the second PCB, wherein the first PCB is configured to join to the second PCB to connect each of the terminal ends of the plurality of cables to corresponding pins of the plurality of IO connector pins.

In some aspects, the techniques described herein relate to an apparatus, wherein the apparatus is part of a Quad Speed Form-factor Pluggable-Double Density (QSFP-DD) network interface module.

In some aspects, the techniques described herein relate to an apparatus, further including: a thin layer of elastomer impregnated with metal conductive particles, the thin layer of elastomer positioned between the first PCB and the second PCB and the metal conductive particles are configured to electrically connect the terminal ends of the plurality of cables to the corresponding pins of the plurality of IO connector pins.

In some aspects, the techniques described herein relate to an apparatus, wherein connections between the terminal ends of the plurality of cables and the corresponding pins of the IO connector pins located between first and second PCBs are electrically isolated to prevent cross talk from one another.

In some aspects, the techniques described herein relate to an apparatus, the first PCB includes multiple layers including: a first layer having multiple slots to receive the plurality of cables; and a second layer having openings for the terminal ends of the cables.

In some aspects, the techniques described herein relate to an apparatus, wherein the plurality of cables are fiber optic cables.

In some aspects, the techniques described herein relate to an apparatus, wherein the plurality of cables are twinax cables.

In some aspects, the techniques described herein relate to an apparatus, wherein the terminal ends of the plurality of cables are connected to the corresponding pins of the plurality of IO connector pins via a solder connection.

In some aspects, the techniques described herein relate to an apparatus, wherein the first PCB includes a plurality of grounding structures each surrounding an exposed shield portion of each of the plurality of cables.

In some aspects, the techniques described herein relate to a device for connecting cables to Input Output (IO) connector pins, including: a plurality of cables terminating in terminal ends; a housing for housing the plurality of cables; IO connectors terminating in a plurality of IO connector pins; an IO fixture for housing the plurality of IO connectors; a first Printed Circuit Board (PCB) configured to receive the terminal ends of the plurality of cables, wherein the terminal ends of the plurality of cables are electrically isolated from one another in the first PCB; and a second PCB configured to receive the plurality of IO connector pins, wherein the IO connector pins are electrically isolated from one another in the second PCB, wherein the first PCB is configured to join to the second PCB to connect each of the terminal ends of the plurality of cables to corresponding pins of the plurality of IO connector pins.

In some aspects, the techniques described herein relate to a device, wherein the IO fixture is a connector form factor configured to be received by a port of a network device.

In some aspects, the techniques described herein relate to a device, wherein the device is a Quad Speed Form-factor Pluggable-Double Density (QSFP-DD) network interface module.

In some aspects, the techniques described herein relate to a device, further including: a thin layer of elastomer impregnated with metal conductive particles, the thin layer of elastomer positioned between the first PCB and the second PCB and the metal conductive particles are configured to electrically connect the terminal ends of the plurality of cables to the corresponding pins of the plurality of IO connector pins.

In some aspects, the techniques described herein relate to a device, wherein connections between the terminal ends of the plurality of cables and the corresponding pins of the plurality of IO connector pins located between first and second PCBs are electrically isolated to prevent cross talk from one another.

In some aspects, the techniques described herein relate to a device, the first PCB includes multiple layers including: a first layer having multiple slots to receive the plurality of cables; and a second layer having openings for the terminal ends of the cables.

In some aspects, the techniques described herein relate to a device, wherein the plurality of cables are twinax cables.

In some aspects, the techniques described herein relate to a device, wherein the terminal ends of the plurality of cables are connected to the corresponding pins of the plurality of IO connector pins via a solder connection.

In some aspects, the techniques described herein relate to a method including: inserting terminal ends of a plurality of cables into a first Printed Circuit Board (PCB) to electrically isolate the terminal ends of the plurality of cables from one another in the first PCB; inserting a plurality of IO connector pins into a second PCB to electrically isolated the plurality of IO connector pins from one another in the second PCB; and joining the first PCB to the second PCB such that terminal ends of the plurality of cables electrically connect to corresponding pins of the plurality of IO connector pins.

In some aspects, the techniques described herein relate to a method, further including: inserting a thin elastomer layer impregnated with metal conductive particles between the first PCB and the second PCB before joining the first PCB to the second PCB.

In some aspects, the techniques described herein relate to a method, wherein joining the first PCB to the second PCB such that the terminal ends of the plurality of cables electrically connect to the corresponding pins of the plurality of IO connector pins includes compressing the thin elastomer layer between the first PCB to the second PCB.

VARIATIONS AND IMPLEMENTATIONS

Note that in this Specification, references to various features (e.g., elements, structures, nodes, modules, components, engines, logic, steps, operations, functions, characteristics, etc.) included in "one embodiment," "example embodiment," "an embodiment," "another." "other embodiment." "certain embodiments," "some embodiments," "various embodiments," "other embodiments," "alternative embodiment," and the like are intended to mean that any such features are included in one or more embodiments of the present disclosure, but may or may not necessarily be combined in the same embodiments.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase "at least one of," "one or more of," "and/or," variations thereof, or the like are open-ended expressions that are both conjunctive and disjunctive in operation for any and all possible combination of the associated listed items. For example, each of the expressions "at least one of X, Y and Z," "at least one of X, Y or Z," "one or more of X, Y and Z," "one or more of X, Y or Z" and "X, Y and/or Z" can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

Additionally, unless expressly stated to the contrary, the terms "first," "second," "third," etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, "first X" and "second X" are intended to designate two "X" elements that are not necessarily limited by any order, rank, importance, temporal sequence, or hierarchy of the two elements. Further as referred to herein, "at least one of" and "one or more of" can be represented using the "(s)" nomenclature (e.g., one or more element(s)).

The above description is intended by way of example only. Although the techniques are illustrated and described herein as embodied in one or more specific examples, it is nevertheless not intended to be limited to the details shown, since various modifications and structural changes may be made within the scope and range of equivalents of the claims.

What is claimed is:

1. An apparatus for connecting cables to Input Output (IO) connector pins, comprising:
   a first Printed Circuit Board (PCB) configured to receive terminal ends of a plurality of cables, wherein the terminal ends of the plurality of cables are electrically isolated from one another in the first PCB; and
   a second PCB configured to receive a plurality of IO connector pins, wherein the plurality of IO connector pins are electrically isolated from one another in the second PCB,
   wherein the first PCB is configured to join to the second PCB to connect each of the terminal ends of the plurality of cables to corresponding pins of the plurality of IO connector pins.

2. The apparatus of claim 1, wherein the apparatus is part of a Quad Speed Form-factor Pluggable—Double Density (QSFP-DD) network interface module.

3. The apparatus of claim 1, further comprising:
   a thin layer of elastomer impregnated with metal conductive particles, the thin layer of elastomer positioned between the first PCB and the second PCB and the metal conductive particles are configured to electrically connect the terminal ends of the plurality of cables to the corresponding pins of the plurality of IO connector pins.

4. The apparatus of claim 1, wherein connections between the terminal ends of the plurality of cables and the corresponding pins of the IO connector pins located between first and second PCBs are electrically isolated to prevent cross talk from one another.

5. The apparatus of claim 1, the first PCB includes multiple layers comprising:
   a first layer having multiple slots to receive the plurality of cables; and
   a second layer having openings for the terminal ends of the cables.

6. The apparatus of claim 1, wherein the plurality of cables are fiber optic cables.

7. The apparatus of claim 1, wherein the plurality of cables are twinax cables.

8. The apparatus of claim 1, wherein the terminal ends of the plurality of cables are connected to the corresponding pins of the plurality of IO connector pins via a solder connection.

9. The apparatus of claim 1, wherein the first PCB includes a plurality of grounding structures each surrounding an exposed shield portion of each of the plurality of cables.

10. A device for connecting cables to Input Output (IO) connector pins, comprising:
   a plurality of cables terminating in terminal ends;
   a housing for housing the plurality of cables;
   IO connectors terminating in a plurality of IO connector pins;
   an IO fixture for housing the plurality of IO connectors;
   a first Printed Circuit Board (PCB) configured to receive the terminal ends of the plurality of cables, wherein the terminal ends of the plurality of cables are electrically isolated from one another in the first PCB; and
   a second PCB configured to receive the plurality of IO connector pins, wherein the IO connector pins are electrically isolated from one another in the second PCB,
   wherein the first PCB is configured to join to the second PCB to connect each of the terminal ends of the plurality of cables to corresponding pins of the plurality of IO connector pins.

11. The device of claim 10, wherein the IO fixture is a connector form factor configured to be received by a port of a network device.

12. The device of claim 10, wherein the device is a Quad Speed Form-factor Pluggable-Double Density (QSFP-DD) network interface module.

13. The device of claim 10, further comprising:
   a thin layer of elastomer impregnated with metal conductive particles, the thin layer of elastomer positioned between the first PCB and the second PCB and the metal conductive particles are configured to electrically connect the terminal ends of the plurality of cables to the corresponding pins of the plurality of IO connector pins.

14. The device of claim 10, wherein connections between the terminal ends of the plurality of cables and the corresponding pins of the plurality of IO connector pins located between first and second PCBs are electrically isolated to prevent cross talk from one another.

15. The device of claim 10, the first PCB includes multiple layers comprising:

a first layer having multiple slots to receive the plurality of cables; and a second layer having openings for the terminal ends of the cables.

16. The device of claim 10, wherein the plurality of cables are twinax cables.

17. The device of claim 10, wherein the terminal ends of the plurality of cables are connected to the corresponding pins of the plurality of IO connector pins via a solder connection.

18. A method comprising:

inserting terminal ends of a plurality of cables into a first Printed Circuit Board (PCB) to electrically isolate the terminal ends of the plurality of cables from one another in the first PCB;

inserting a plurality of IO connector pins into a second PCB to electrically isolated the plurality of IO connector pins from one another in the second PCB; and joining the first PCB to the second PCB such that terminal ends of the plurality of cables electrically connect to corresponding pins of the plurality of IO connector pins.

19. The method of claim 18, further comprising:

inserting a thin elastomer layer impregnated with metal conductive particles between the first PCB and the second PCB before joining the first PCB to the second PCB.

20. The method of claim 19, wherein joining the first PCB to the second PCB such that the terminal ends of the plurality of cables electrically connect to the corresponding pins of the plurality of IO connector pins comprises compressing the thin elastomer layer between the first PCB to the second PCB.

* * * * *